US009209254B2

(12) United States Patent
Fujikane et al.

(10) Patent No.: US 9,209,254 B2
(45) Date of Patent: Dec. 8, 2015

(54) STRUCTURE AND MANUFACTURING METHOD OF THE STRUCTURE, AND GALLIUM NITRIDE-BASED SEMICONDUCTOR LIGHT-EMITTING DEVICE USING THE STRUCTURE AND MANUFACTURING METHOD OF THE DEVICE

(71) Applicant: Panasonic Corporation, Osaka (JP)

(72) Inventors: Masaki Fujikane, Osaka (JP); Akira Inoue, Osaka (JP); Toshiya Yokogawa, Nara (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/290,311

(22) Filed: May 29, 2014

(65) Prior Publication Data

US 2014/0264372 A1 Sep. 18, 2014

Related U.S. Application Data

(63) Continuation of application No. PCT/JP2013/005281, filed on Sep. 5, 2013.

(30) Foreign Application Priority Data

Oct. 1, 2012 (JP) ................. 2012-219533

(51) Int. Cl.
*H01L 29/20* (2006.01)
*H01L 21/02* (2006.01)
*H01L 33/40* (2010.01)
*H01L 33/32* (2010.01)
*H01L 33/16* (2010.01)

(52) U.S. Cl.
CPC ........ *H01L 29/2003* (2013.01); *H01L 21/0254* (2013.01); *H01L 33/16* (2013.01); *H01L 33/32* (2013.01); *H01L 33/405* (2013.01)

(58) Field of Classification Search
None
See application file for complete search history.

(56) References Cited

U.S. PATENT DOCUMENTS 6,329,716 B1   12/2001   Nido et al.
8,816,373 B2 *  8/2014   Gehrke .................. H01L 33/60
                                                                  257/98

(Continued)

FOREIGN PATENT DOCUMENTS

JP   10-200161 A    7/1998
JP   2005-197687 A  7/2005

(Continued)

OTHER PUBLICATIONS

Okamoto, Koichi, et al. "Surface-plasmon-enhanced light emitters based on InGaN quantum wells." Nature materials 3.9 (2004): 601-605.*

(Continued)

*Primary Examiner* — William Coleman
*Assistant Examiner* — Kien Ly
(74) *Attorney, Agent, or Firm* — Renner, Otto, Boisselle & Sklar, LLP

(57) ABSTRACT

In a structure including a gallium nitride-based semiconductor having an m-plane as a principal plane, and a metal layer provided on the principal plane, the principal plane has an n-type conductivity. An interface between the gallium nitride-based semiconductor and the metal layer contains oxygen. The metal layer includes a crystal grain extending form a lower surface to an upper surface of the metal layer.

16 Claims, 19 Drawing Sheets

(56) References Cited

U.S. PATENT DOCUMENTS

| | | | |
|---|---|---|---|
| 2001/0054763 A1 | 12/2001 | Nido et al. | |
| 2005/0145876 A1 | 7/2005 | Kwak et al. | |
| 2007/0231978 A1* | 10/2007 | Kanamoto et al. | 438/154 |
| 2010/0051978 A1 | 3/2010 | Katsuno et al. | |
| 2011/0049541 A1 | 3/2011 | Katsuno et al. | |
| 2011/0220871 A1 | 9/2011 | Kamikawa et al. | |
| 2012/0001223 A1* | 1/2012 | Inoue | H01L 33/14 257/103 |
| 2012/0002271 A1* | 1/2012 | Kuramoto et al. | 359/344 |
| 2012/0187442 A1 | 7/2012 | Masaki et al. | |

FOREIGN PATENT DOCUMENTS

| | | |
|---|---|---|
| JP | 2008-171884 A | 7/2008 |
| JP | 2010-56423 A | 3/2010 |
| JP | 2010-062274 A | 3/2010 |
| JP | 2011-049322 A | 3/2011 |
| JP | 2012-80142 A | 4/2012 |

OTHER PUBLICATIONS

Peng, L-H., et al. "Photoenhanced wet oxidation of gallium nitride." Applied Physics Letters 76.4 (2000): 511-513.*

Inoue, S., et al. "Growth of single crystalline GaN on silver mirrors." Applied Physics Letters 91.20 (2007): 201920.*

International Search Report for corresponding International Application No. PCT/JP2013/005281, mailed on Nov. 26, 2013.

Form PCT/ISA/237 for corresponding International Application No. PCT/JP2013/005281 dated Nov. 26, 2013.

Jun Ho Son et al., "Effects of Ni cladding layers on suppression of Ag agglomeration in Ag-based Ohmic contacts of p-GaN", Applied Physics Letters, vol. 95, p. 602108, dated Aug. 14, 2009.

* cited by examiner $(0001)$ c-PLANE c-AXIS $(10\bar{1}0)$ m-PLANE c-AXIS $(11\bar{2}0)$ a-PLANE c-AXIS $(\bar{1}012)$ r-PLANE c-AXIS

STRUCTURE AND MANUFACTURING METHOD OF THE STRUCTURE, AND GALLIUM NITRIDE-BASED SEMICONDUCTOR LIGHT-EMITTING DEVICE USING THE STRUCTURE AND MANUFACTURING METHOD OF THE DEVICE

CROSS-REFERENCE TO RELATED APPLICATIONS

This is a continuation of International Application No. PCT/JP2013/005281 filed on Sep. 5, 2013, which claims priority to Japanese Patent Application No. 2012-219533 filed on Oct. 1, 2012. The entire disclosures of these applications are incorporated by reference herein.

BACKGROUND

The present disclosure relates to structures each of which includes a gallium nitride-based semiconductor layer having a surface that is a nonpolar plane or a semi-polar plane, and includes a metal layer provided on the surface of the gallium nitride-based semiconductor layer.

Nitride semiconductors containing nitrogen (N) as a group V element have been expected as a material of a short wavelength light-emitting element because of their band gap size. In particular, gallium nitride-based compound semiconductors (GaN-based semiconductors) containing Ga as a group III element have been intensively studied, and blue light-emitting diode (LED) elements, green LED elements, and semiconductor laser elements formed of GaN-based semiconductors have also been commercialized.

GaN-based semiconductors have a wurtzite crystal structure. FIG. 1 schematically illustrates a unit lattice of GaN. In $Al_xGa_yIn_zN$ semiconductor crystal (where $0 \leq x < 1$, $0 < y \leq 1$, $0 \leq z < 1$, and $x+y+z=1$), some of Ga atoms illustrated in FIG. 1 may be substituted with at least one of Al or In.

FIG. 2 shows fundamental vectors $a_1$, $a_2$, $a_3$ and c of the wurtzite crystal structure. The fundamental vector c extends in a [0001] direction, and this direction is referred to as a "c-axis." A plane perpendicular to the c-axis is referred to as a "c-plane" or a "(0001) plane." A plane terminated with group III elements, such as Ga, is referred to as a "+c-plane" or a "(0001) plane," and a plane terminated with group V elements, such as nitrogen, is referred to as a "−c-plane" or a "(000-1) plane," and these planes are distinguished from each other.

In the case where a semiconductor element is fabricated using a GaN-based semiconductor, in general, a c-plane substrate, that is, a substrate having a (0001) plane as a growth surface is used as a substrate on which a GaN-based semiconductor crystal is grown. However, in the c-plane, Ga atoms and nitrogen atoms are not present on the same atomic plane, and therefore, electrical polarization occurs. For this reason, the "c-plane" is also referred to as a "polar plane." As a result of the electrical polarization, a piezoelectric field is generated along the c-axis in an InGaN quantum well layer included in an active layer of the gallium nitride-based semiconductor light-emitting device. Due to the piezoelectric field generated in the active layer, electrons and holes distributed in the active layer are displaced, and the internal quantum efficiency of the active layer is decreased due to a quantum-confined Stark effect of carriers. This increases a threshold current in the case of a semiconductor laser element. This also increases power consumption and reduces luminous efficiency in the case of an LED. This further increases implanted carrier concentration, piezoelectric field screening, and a change in light emission wavelength.

To solve these problems, using a substrate (an m-plane GaN-based substrate) having a nonpolar plane as its growth surface, e.g., a (10-10) plane called an m-plane that is perpendicular to the [10-10] direction, has been considered. The sign "-" given to the left side of an index of Miller indices in parentheses indicates a "bar (inversion)" of that index, and corresponds to the "bar" in the drawing. As illustrated in FIG. 2, m-plane is in parallel with c-axis and is orthogonal to c-plane. In the m-plane, Ga atoms and nitrogen atoms are present on the same atomic plane, and therefore, spontaneous electrical polarization does not occur in a direction perpendicular to the m-plane. This means that a piezoelectric field is not generated in the active layer, and the above problems are solved, if a stacking semiconductor structure is formed in the direction perpendicular to the m-plane. The m-plane is a collective term for (10-10) plane, (−1010) plane, (1-100) plane, (−1100) plane, (01-10) plane, and (0-110) plane.

As illustrated in FIG. 3C, a-plane is in parallel with the c-axis (a fundamental vector c) and is orthogonal to the c-plane illustrated in FIG. 3A. The a-plane is a collective term for (11-20) plane, (−1-120) plane, (1-210) plane, (−12-10) plane, (−2110) plane, and (2-1-10) plane.

FIG. 3D illustrates r-plane, which is a collective term for (10-12) plane, (−1012) plane, (1-102) plane, (−1102) plane, (01-12) plane, and (0-112) plane.

Further, −r-plane is a collective term for (10-1-2) plane, (−101-2) plane, (1-10-2) plane, (−110-2) plane, (01-1-2) plane, and (0-11-2) plane.

Japanese Unexamined Patent Publication No. 2005-197687 discloses a technique that uses a structure of an anti-oxidation electrode/an aggregation-prevention electrode/a reflecting electrode/a contact electrode/a p-type GaN, to prevent aggregation of the reflecting electrode formed of silver (Ag), rhodium (Rh), aluminum (Al) or tin (Sn).

Jun Ho Son, Yang Hee Song, Hak Ki Yu, and Jong-Lam Lee, "Applied Physics Letters" Vol. 95, P. 062108, Aug. 14, 2009 discloses a technique in which in order to increase a reflection coefficient of an Ag electrode and reduce contact resistance, a nickel (Ni) layer is formed on an interface between a GaN layer and an Ag layer, thereby promoting crystallization of Ag.

Japanese Unexamined Patent Publication No. 2010-56423 discloses an electrode for a semiconductor light-emitting device, and the electrode includes an Ag alloy layer added with palladium (Pd) and copper (Cu) or germanium (Ge), using Ag as a principal component, to achieve both of a high reflection coefficient and a low contact resistance of the electrode.

Japanese Unexamined Patent Publication No. 2010-062274 discloses a semiconductor light-emitting diode which includes: a stacking structure including an n-type semiconductor layer, a p-type semiconductor layer, and a light-emitting layer provided between the n-type semiconductor layer and the p-type semiconductor layer; a first electrode connected to the n-type semiconductor layer and containing at least one of silver or a silver alloy; and a second electrode connected to the p-type semiconductor layer.

Japanese Unexamined Patent Publication No. 2012-080142 discloses a method for manufacturing a semiconductor light-emitting diode which includes: a stacking structure including a first semiconductor layer of a first conductivity type, a second semiconductor layer of a second conductivity type, and a light-emitting layer provided between the first semiconductor layer and the second semiconductor layer; and an electrode provided on the second semiconductor layer disposed opposite to the light-emitting layer. In this publication, a first metal layer containing silver or a silver alloy is formed on a surface of the second semiconductor layer disposed opposite to the light-emitting layer, and a second metal layer containing at least one element of platinum, palladium and rhodium is formed on the first metal layer. The second semiconductor layer, the first metal layer, and the second metal layer are sintered in an atmosphere containing oxygen. The sintering temperature is such a temperature that makes an average particle diameter of silver contained in the sintered first metal layer is not more than three times an average particle diameter of the silver before sintering.

Japanese Unexamined Patent Publication No. H10-200161 discloses performing oxygen plasma ashing on a surface of an n-type GaN contact layer, and thereafter forming an electrode in which a Ti layer, an Al layer, a Pt layer, and an Au layer are sequentially formed.

SUMMARY

According to the above conventional techniques, however, further improvement of the external quantum efficiency has been demanded.

An objective of a non-limiting example embodiment of the present application is to improve a reflection coefficient and a contact resistance of a metal layer, and thereby increase the external quantum efficiency.

To achieve the above objective, an aspect of the present disclosure is directed to a structure including a gallium nitride-based semiconductor layer having an m-plane as a principal plane and a silver layer provided on the principal plane, wherein the principal plane has an n-type conductivity, and an interface between the gallium nitride-based semiconductor layer and the silver layer contains oxygen, and the silver layer includes a crystal grain extending from a lower surface to an upper surface of the silver layer.

An embodiment of the present disclosure improves a reflection coefficient and a contact resistance of a metal layer, and increases the external quantum efficiency.

DETAILED DESCRIPTION

Figure 1:
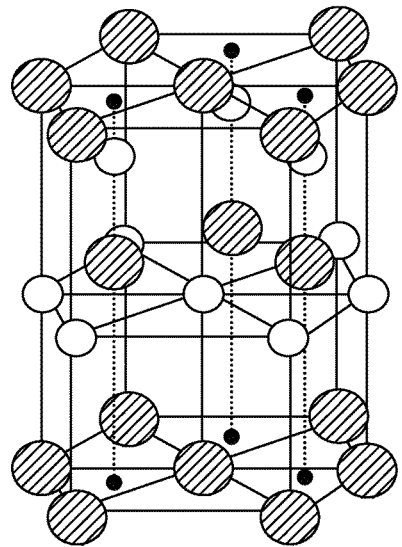
FIG. 1 is an oblique view schematically showing a unit lattice of GaN.
Figure 1:
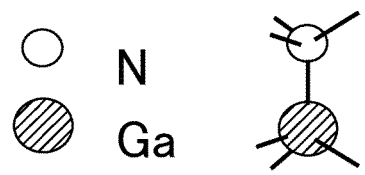
Figure 2:
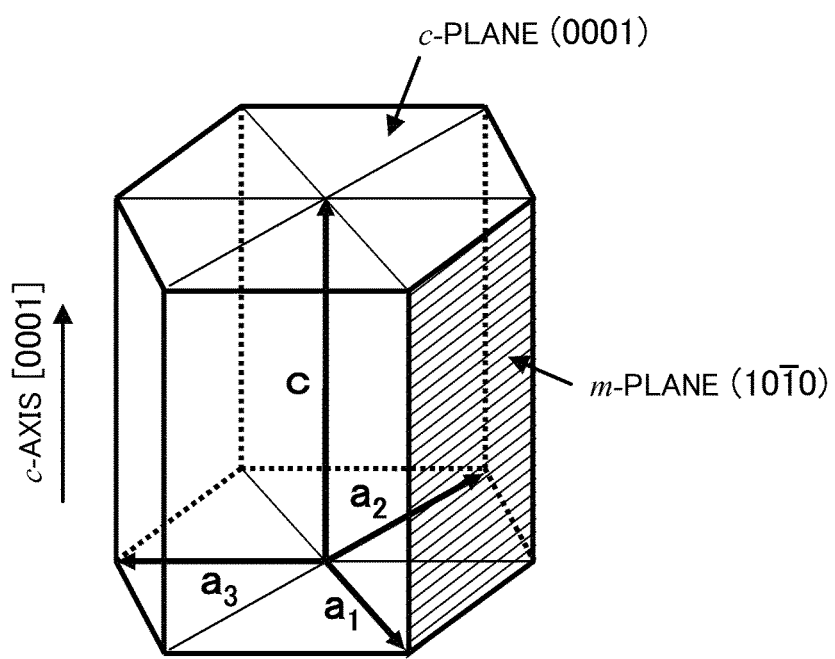
FIG. 2 is an oblique view showing fundamental vectors $a_1$, $a_2$, $a_3$, and c of a wurtzite crystal structure.
Figure 3A:
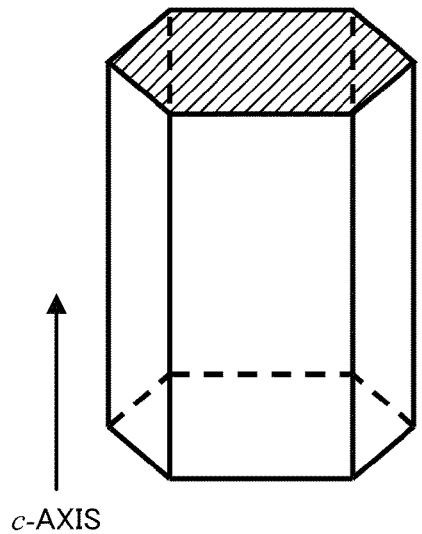
FIG. 3A to FIG. 3D schematically shows typical crystalline plane orientation of a hexagonal wurtzite structure.
Figure 3B:
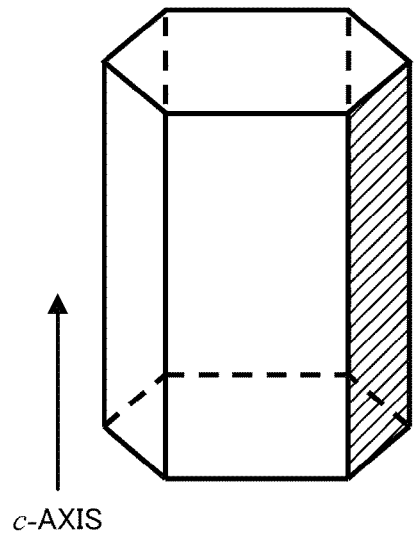
Figure 3C:
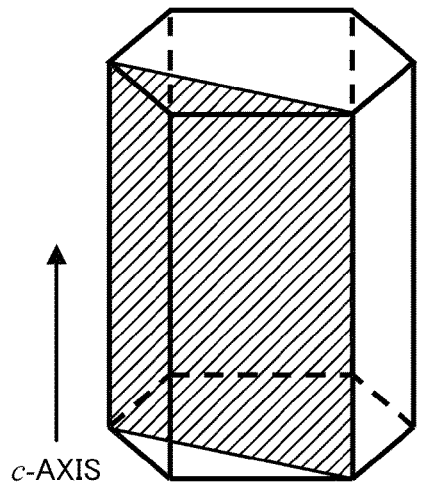
Figure 3D:
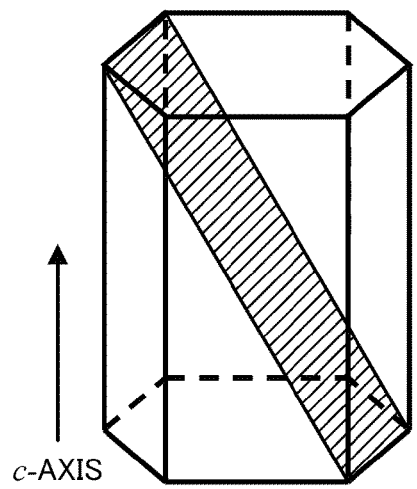

In the invention disclosed in Japanese Unexamined Patent Publication No. 2005-197687, Ag, Rh, Al or Sn is used for the reflecting electrode, and the contact electrode needs to be selected from the group consisting of an La-based alloy, an Ni-based alloy, a Zn-based alloy, a Cu-based alloy, a thermoelectric oxide, a doped In oxide, ITO, and ZnO. The process may thus be complicated.

In the invention disclosed in Jun Ho Son, Yang Hee Song, Hak Ki Yu, and Jong-Lam Lee, "Applied Physics Letters" Vol. 95, P. 062108, Aug. 14, 2009, an Ni layer, i.e., a dissimilar metal, needs to be inserted between a GaN layer and an Ag layer.

In the invention disclosed in Japanese Unexamined Patent Publication No. 2010-56423, dissimilar elements, such as Pd and Cu or Ge, needs to be added to Ag. The process may thus be complicated in this case as well.

In an embodiment of the present disclosure, it is possible to provide a gallium nitride-based semiconductor light-emitting device of which the external quantum efficiency is greater than the external quantum efficiencies of the conventional techniques described above.

In order to extract light from a semiconductor light-emitting device with high efficiency, it is necessary to reduce as much light that is absorbed inside and outside a light-emitting element as possible. Depositing Al or Ag, which is a metal with a high reflection coefficient, or an alloy containing Al and Ag, on a semiconductor layer may be a way of reducing absorption of light. Such a metal layer can be used as an electrode which allows a current to flow in the light-emitting element. However, in some of combinations of semiconductor and metal, an ohmic contact may fail to be formed and the power conversion efficiency may be reduced. Further, such a metal layer has a low resistance to heat and other disturbances, and an interface reflection coefficient between the semiconductor layer and the metal layer is low. Thus, light-extraction efficiency may be reduced in some cases.

In the embodiment of the present disclosure, the affinity between a semiconductor layer and a metal layer becomes stronger, and the semiconductor layer and the metal layer form a definite, or planar interface, by modifying the surface of the semiconductor. As a result, a reflection coefficient is improved and the long-term reliability is also improved. Moreover, it is possible to form an ohmic contact between semiconductor and metal between which an ohmic contact could not be formed by conventional techniques.

For example, a structure according to an embodiment is a structure including: a gallium nitride-based semiconductor layer having an m-plane as a principal plane; and a silver layer provided on the principal plane. The principal plane has an n-type conductivity. An interface between the gallium nitride-based semiconductor layer and the silver layer contains oxygen. The silver layer includes a crystal grain extending from a lower surface to an upper surface of the silver layer.

In one embodiment, surface plasmon resonance absorption is preferably not observed in light reflected by the interface between the gallium nitride-based semiconductor layer and the silver layer, within a wavelength range of from 450 nm to 500 nm.

In one embodiment, the silver layer may have a thickness of not less than 200 nm.

In one embodiment, the silver layer may have a thickness of not more than 1200 nm.

In one embodiment, the crystal grain may have a maximum length of not less than 200 nm.

In one embodiment, the crystal grain may have a maximum length of not more than 1200 nm.

In one embodiment, an oxygen concentration at the interface between the gallium nitride-based semiconductor layer and the silver layer may be not less than 30 times and not more than 200 times an oxygen concentration in the silver layer.

In one embodiment, an oxygen concentration at the interface between the gallium nitride-based semiconductor layer and the silver layer may be not less than $3 \times 10^{20}$ cm$^{-3}$ and not more than $2 \times 10^{21}$ cm$^{-3}$, and an oxygen concentration in the silver layer may be not more than $1 \times 10^{19}$ cm$^{-3}$.

In one embodiment, an arithmetic average roughness Ra of the interface of the silver layer with the gallium nitride-based semiconductor layer in an in-plane direction may be not less than 0.27 nm and not more than 2.65 nm in the case of a reference length of 3.5 μm.

A gallium nitride-based semiconductor light-emitting device of another embodiment is a gallium nitride-based semiconductor light-emitting device including: the structure of one embodiment; a p-type gallium nitride-based semiconductor layer, and a light-emitting layer sandwiched between the gallium nitride-based semiconductor layer and the p-type gallium nitride-based semiconductor layer, wherein the gallium nitride-based semiconductor layer is an n-type gallium nitride-based semiconductor layer, and the silver layer is an electrode for the n-type gallium nitride-based semiconductor layer.

A structure manufacturing method of another embodiment includes: a step of exposing a surface of the gallium nitride-based semiconductor layer to an atmosphere containing active oxygen, and a step of forming the silver layer on the surface of the gallium nitride-based semiconductor layer.

In another embodiment, the method may further include a step of performing heat treatment on the structure after forming the silver layer.

In another embodiment, the step of exposing to the atmosphere containing the active oxygen may include a step of irradiating the surface of the gallium nitride-based semiconductor layer with ultraviolet light under a condition where the surface is exposed to a gas or a liquid containing an oxygen atom or an oxygen molecule.

In another embodiment, the step of exposing to the atmosphere containing the active oxygen may include a step of exposing the surface of the gallium nitride-based semiconductor layer to an atmosphere containing oxygen plasma.

Still another embodiment is directed to a method for manufacturing a gallium nitride-based semiconductor light-emitting device using the method for manufacturing the structure. The gallium nitride-based semiconductor layer is an n-type gallium nitride-based semiconductor layer. The method for manufacturing a gallium nitride-based semiconductor light-emitting device includes a step of manufacturing, on the n-type gallium nitride-based semiconductor layer, a stacking semiconductor structure including a light-emitting layer and a p-type gallium nitride-based semiconductor layer.

The first embodiment will be described below with reference to the drawings.

First Embodiment

A structure which includes a gallium nitride-based semiconductor layer and a metal layer according to the first embodiment will be described with reference to FIG. 4.

Figure 4:
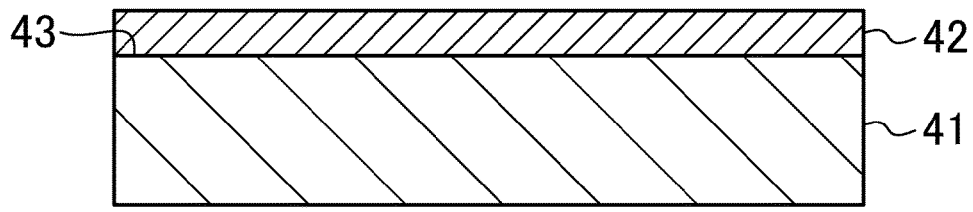
FIG. 4 is a cross-sectional view of a structure including a gallium nitride-based semiconductor layer and a metal layer of the first embodiment.

At first, as shown in FIG. 4, an n-type gallium nitride-based semiconductor 41 is prepared. The n-type gallium nitride-based semiconductor 41 may be simply referred to as a "semiconductor 41." The semiconductor 41 is a semiconductor layer having a crystal plane, other than a c-plane, as a growth surface, or is part of a stacking semiconductor structure. In the present embodiment, an uppermost surface of the semiconductor 41 which is a crystal plane other than the c-plane is modified (surface modification) through an oxidation reaction, thereby controlling the wettability of the uppermost surface. Specifically, for example, the uppermost surface of the semiconductor 41 is exposed to an oxygen plasma atmosphere to increase the hydrophilicity of the uppermost surface. According to the evaluation by the inventors of the present application, a gallium nitride-based semiconductor is hydrophilic, in general, but effects of the present embodiment can be increased by controlling the wettability of the gallium nitride-based semiconductor to be closer to "super-hydrophilicity."

The crystal plane other than the c-plane is, for example, a crystal plane tilted at the angle of not less than 18° and not more than 90° with respect to a c-axis of the GaN-based semiconductor. The wettability of the gallium nitride-based semiconductor can be much closer to "super-hydrophilicity" by applying the present embodiment to a crystal plane tilted at the angle of not less than 18° and not more than 90° with respect to the c-axis of the GaN-based semiconductor. This may be caused by an atomic structure of the surface of the GaN-based semiconductor. In $sp^3$ hybrid orbitals, atomic bonds form an angle of 108°. Thus, not less than two atomic bonds exist in the crystal plane of the GaN-based semiconductor which is tilted at the angle of not less than 18°, obtained by subtracting 90° from the 108°, with respect to the c-axis. This means that the atomic structure of the crystal plane is different from the atomic structure of the c-plane. Both of a surface of an m-plane GaN-based semiconductor and a surface of an a-plane GaN-based semiconductor are tilted with respect to the c-axis of the GaN-based semiconductor by 90°, which is in the above range. Both of a surface of a −r-plane GaN-based semiconductor and a surface of a +r-plane GaN-based semiconductor are tilted with respect to the c-axis of the GaN-based semiconductor by about 43°, which is in the above range.

The "m-plane" of the present embodiment includes not only a plane that is completely parallel to an non-tilted m-plane, but also a plane that is tilted within ±5° in either direction with respect to the non-tilted m-plane. Effects of spontaneous electrical polarization are very small in the case where the plane is slightly tilted with respect to the m-plane. In crystal growth techniques, there are cases in which a semiconductor layer can be epitaxially grown more readily on a substrate having a surface slightly tilted with respect to crystal orientation than on a substrate having a surface strictly aligned to the crystal orientation. Thus, in some cases, it is effective to tilt a crystal plane that is a surface on which a semiconductor layer is epitaxially grown, in order to improve the quality of the semiconductor layer and increase a crystal growth rate, while sufficiently reducing effects of the spontaneous electrical polarization.

Further, the plane slightly tilted as a whole with respect to the non-tilted m-plane has a lot of step-like, exposed m-plane areas having properties similar to those of the m-plane. The "m-plane" of the present disclosure includes a plane which has a plurality of step-like m-plane areas.

Further, a plane that is tilted within ±5° in either direction with respect to a non-tilted a-plane, +r-plane, −r-plane, S-plane ((10-11) plane), n-plane ((11-23) plane), R-plane ((10-14) plane), (11-22) plane, (20-21) plane, (10-13) plane, (20-2-1) plane, or (10-1-3) plane, etc., has properties similar to those of its corresponding non-tilted plane. Thus, the "a-plane," "+r-plane," "−r-plane," "S-plane," "n-plane," "R-plane," "(11-22) plane," "(20-21) plane," "(10-13) plane," "(20-2-1) plane" or "(10-1-3) plane," etc., of the present disclosure includes a plane that is tilted within ±5° in either direction with respect to its corresponding non-tilted a-plane, +r-plane, −r-plane, S-plane, n-plane, R-plane, (11-22) plane, (20-21) plane, (10-13) plane, (20-2-1) plane, or (10-1-3) plane, etc.

Next, as shown in FIG. 4, a surface of the n-type gallium nitride-based semiconductor 41 is directly covered with a metal layer 42 having a thickness of not less than 200 nm and not more than 1200 nm and containing silver (Ag) or aluminum (Al) or both of silver (Ag) and aluminum (Al). That is, in the present embodiment, the metal layer 42 may be formed of Ag alone, may be formed of Al alone, or may be formed such that Ag and Al form an alloy at a given ratio. In the alloy as used herein, Ag atoms and Al atoms do not need to be uniformly mixed, and either Ag or Al atoms may be unevenly distributed. The definition of the alloy is the same in the second and third embodiments, as well. Further, the metal layer 42 is not limited to the alloy of Ag and Al. For example, the metal layer 42 may have a stacking structure of an Ag single layer and an Al single layer. In the case of applying the stacking structure, the metal which directly contacts with the n-type gallium nitride-based semiconductor 41 may be any one of the Ag single layer and the Al single layer. Another metal layer, in a single layer or a plurality of layers, may be further provided on the metal layer 42.

Since directly covering the modified surface of the semiconductor 41, the metal layer 42 is firmly connected to the semiconductor 41 at an interface 43. Thus, the metal layer 42 is strong against disturbances, such as heat and stress. The maximum length of each crystal grain contained in the metal layer 42 at the interface 43 in the in-plane direction is not less than 200 nm and not more than 1200 nm. Further, the thickness of the crystal grain contained in the metal layer 42 is also not less than 200 nm and not more than 1200 nm. The oxygen concentration in the metal layer 42 is low. This may be because since the crystal grain is relatively large in size, there are less grain boundaries which allows gas to pass through the metal layer 42. On the other hand, the oxygen concentration at the interface 43 is high due to the surface modification. The oxygen concentration at the interface 43 is not less than 30 times and not more than 200 times the oxygen concentration in the metal layer 42. For example, the oxygen concentration at the interface 43 is not less than $3 \times 10^{20}$ cm$^{-3}$ and not more than $2 \times 10^{21}$ cm$^{-3}$, and the oxygen concentration in the metal layer 42 is not more than $1 \times 10^{19}$ cm$^{-3}$. As described above, the metal layer 42 is firmly connected to the semiconductor 41 at the interface 43. Thus, the arithmetic average roughness Ra of the interface 43 of the metal layer 42 in the in-plane direction is not less than 0.27 nm and not more than 2.65 nm in the case of a reference length of 3.5 μm.

In the first embodiment, the n-type gallium nitride-based semiconductor 41 may have an n-type conductivity at least at only a surface part contacting with the metal layer 42.

Second Embodiment

A gallium nitride-based semiconductor light-emitting device of the second embodiment will be described below with reference to FIG. 5A.

Figure 5A:
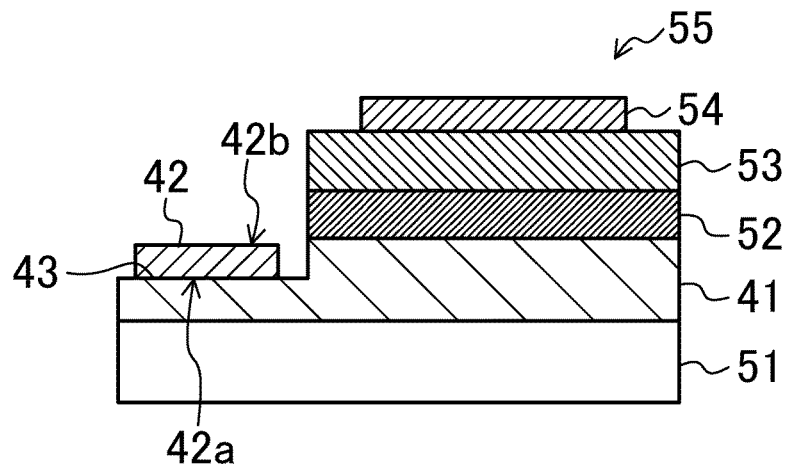
FIG. 5A is a cross-sectional view of a gallium nitride-based semiconductor light-emitting device of the second embodiment.

FIG. 5A shows a cross-sectional structure of a gallium nitride-based semiconductor light-emitting device formed on a gallium nitride-based semiconductor having a nonpolar plane or a semi-polar plane as a growth surface according to the second embodiment.

As shown in FIG. 5A, a nitride semiconductor light-emitting device 55 of the present embodiment includes: a substrate 51 formed of GaN and having an upper surface and a lower surface which are crystal planes other than the c-plane; an n-type gallium nitride-based semiconductor 41, a gallium nitride-based semiconductor active layer 52, and a p-type gallium nitride-based semiconductor 53 sequentially formed on the substrate 51; a p-side electrode 54 formed on and in contact with the p-type gallium nitride-based semiconductor 53; and a metal layer 42 formed on and in contact with an exposed portion of the n-type gallium nitride-based semiconductor 41. In this embodiment, as well, the n-type gallium nitride-based semiconductor 41 and the metal layer 42 have an interface 43, as in the first embodiment.

In the present embodiment, the substrate 51 on which the n-type gallium nitride-based semiconductor 41 is epitaxially grown may be an m-plane GaN substrate, or may be an m-plane GaN layer on a dissimilar substrate, such as an m-plane GaN layer on an m-plane silicon carbide (SiC) substrate and an m-plane GaN layer on an r-plane sapphire substrate. Further, the surface of the substrate 51 is not limited to the m-plane, and may be a crystal plane which produces significant surface modification effects on the n-type gallium nitride-based semiconductor 41. For example, a plane of which a principal plane is tilted at the angle of not less than 18° and not more than 90° with respect to the c-plane may be used as the substrate 51. For example, the principal plane may be m-plane, a-plane, +r-plane, −r-plane, S-plane, n-plane, R-plane, (11-22) plane, (20-21) plane, (10-13) plane, (20-2-1) plane, or (10-1-3) plane.

The n-type gallium nitride-based semiconductor 41 is formed of n-type $Al_uGa_vIn_wN$ (where u+v+w=1, u≥0, v>0, w≥0), for example. For example, silicon (Si) can be used as an n-type dopant.

The p-type gallium nitride-based semiconductor 53 is formed of a p-type $Al_sGa_tN$ semiconductor (where s+t=1, s≥0, t>0), for example. For example, magnesium (Mg) can be used as a p-type dopant. Instead of using Mg as the p-type dopant, zinc (Zn) or beryllium (Be) can be used, for example. In the p-type gallium nitride-based semiconductor 53, Al composition s may be uniform in the thickness direction, or the composition s may be varied in a continuous manner or a stepwise manner. The thickness of the p-type gallium nitride-based semiconductor 53 is, for example, about not less than 0.05 μm and not more than 2 μm. A portion close to the upper surface of the p-type gallium nitride-based semiconductor 53, that is, a portion close to the interface with the p-side electrode 54, can be formed of semiconductor in which Al composition s is zero, that is, GaN. Further, in this case, a p-type impurity may be contained in the GaN in a high concentration, and the high-concentration region can serve as a contact layer.

The gallium nitride-based semiconductor active layer 52 has a multiple quantum well (MQW) structure of GaInN/GaInN, in which, for example, a well layer formed of $Ga_{1-x}In_xN$ with a thickness of about not less than 3 nm and not more than 20 nm, and a barrier layer formed of $Ga_{1-y}In_yN$ with a thickness of about not less than 5 nm and not more than 30 nm (where 0≤y<x<1) are alternately layered.

The wavelength of light emitted from the nitride semiconductor light-emitting device 55 is determined by an In composition x of the $Ga_{1-x}In_xN$ semiconductor that is a semiconductor composition of the well layer. For example, a piezoelectric field is not generated in the gallium nitride-based semiconductor active layer 52 formed on the m-plane. Thus, even if the In composition x is large, a decrease in luminous efficiency can be reduced.

The metal layer 42 is formed of a layer which contains at least one of Ag or Al, for example. That is, in the present embodiment, the metal layer 42 which serves as an n-side electrode may be formed of Ag alone, may be formed of Al alone, or may be formed such that Ag and Al form an alloy at a given ratio. Further, the metal layer 42 may have a stacking structure of an Ag single layer and an Al single layer. In the case of applying the stacking structure, the metal which directly contacts with the n-type gallium nitride-based semiconductor 41 may be any one of the Ag single layer and the Al single layer.

In one embodiment, the p-side electrode 54 covers almost entire surface of the p-type gallium nitride-based semiconductor 53. The p-side electrode 54 has a stacking structure (Pd/Pt) including a palladium (Pd) layer and a platinum (Pt) layer, or a stacking structure (Mg/Ag) including a magnesium (Mg) layer and a silver (Ag) layer.

(First Variation of Second Embodiment)

Figure 5B:
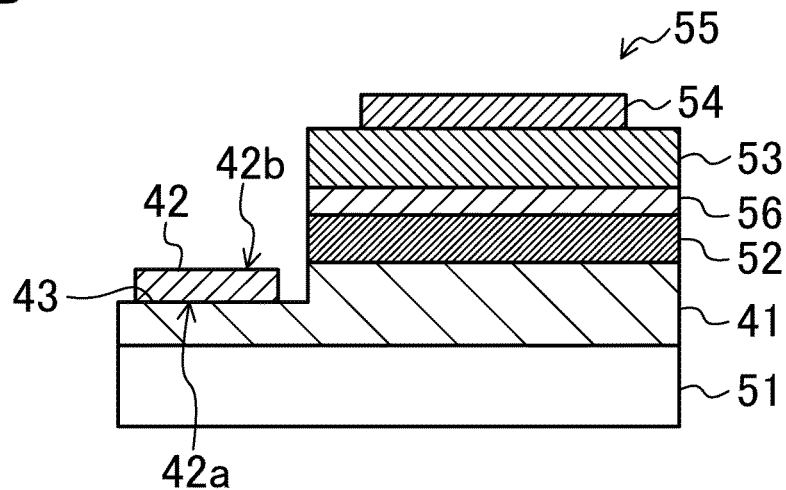
FIG. 5B is a cross-sectional view of a gallium nitride-based semiconductor light-emitting device of the first variation of the second embodiment.

As the first variation, an undoped GaN layer 56 may be formed between the gallium nitride-based semiconductor active layer 52 and the p-type gallium nitride-based semiconductor 53, as in the nitride semiconductor light-emitting device 55 shown in FIG. 5B.

(Second Variation of Second Embodiment)

Figure 5C:
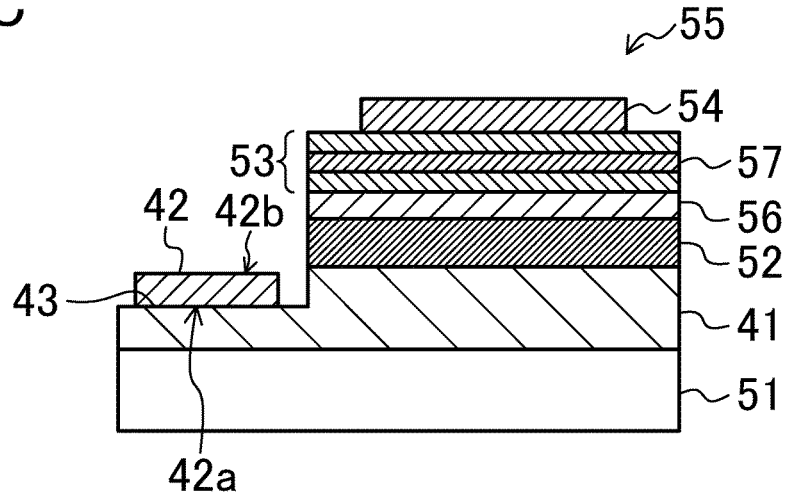
FIG. 5C is a cross-sectional view of a gallium nitride-based semiconductor light-emitting device of the second variation of the second embodiment.

Further, as the second variation, a p-AlGaN layer 57 may be formed in the p-type gallium nitride-based semiconductor 53, as in the nitride semiconductor light-emitting device 55 shown in FIG. 5C. The p-AlGaN layer 57 provided in the p-type gallium nitride-based semiconductor 53 can reduce overflow of electrons injected during the operation of the light-emitting element.

(Manufacturing Method)

Next, a method for manufacturing the nitride semiconductor light-emitting device 55 of the present embodiment will be described with reference to FIG. 5A.

First, an n-type gallium nitride-based semiconductor 41 is epitaxially grown on a growth surface of the substrate 51 formed of n-type GaN, the growth surface being a crystal plane other than the c-plane, by metal organic chemical vapor deposition (MOCVD) method. For example, Si is used as an n-type dopant, and TMG(Ga(CH$_3$)$_3$) as a group-III source and NH$_3$ as a group-V source are supplied as materials, and a growth temperature is set to about not less than 900° C. and not more than 1100° C. As a result, the n-type gallium nitride-based semiconductor 41 formed of GaN and having a thickness of about not less than 1 μm and not more than 3 μm is formed on the substrate 51.

Next, the gallium nitride-based semiconductor active layer 52 is formed on the n-type gallium nitride-based semiconductor 41. The gallium nitride-based semiconductor active layer 52 has, for example, a multiple quantum well (MQW) structure of GaInN/GaN, in which a Ga$_{1-x}$In$_x$N well layer with a thickness of 15 nm and a GaN barrier layer with a thickness of 30 nm are alternately layered. A growth temperature when forming the Ga$_{1-x}$In$_x$N well layer can be reduced to 800° C. to improve efficiencies in incorporating In. The light emission wavelength is selected according to purpose of the nitride semiconductor light-emitting device 55, and the In composition x according to the wavelength can be determined. For example, to obtain the wavelength of 450 nm (blue), the In composition x is determined to be not less than 0.18 and not more than 0.2. To obtain the wavelength of 520 nm (green), the In composition x is determined to be not less than 0.29 and not more than 0.31. To obtain the wavelength of 630 nm (red), the In composition x is determined to be not less than 0.43 and not more than 0.44.

In the case of forming the undoped GaN layer 56 having a thickness, for example, of not less than 15 nm and not more than 50 nm on the gallium nitride-based semiconductor active layer 52, as in the first variation shown in FIG. 5B, the p-type gallium nitride-based semiconductor layer 53 is formed on the undoped GaN layer 56. In forming the p-type gallium nitride-based semiconductor layer 53, Cp$_2$Mg (cyclopentadienyl magnesium), for example, is used as a p-type dopant, and TMG and NH$_3$ are supplied as materials. As a result, the p-type gallium nitride-based semiconductor 53 formed of p-type GaN having a thickness of about not less than 50 nm and not more than 300 nm can be formed at a growth temperature of about not less than 900° C. and not more than 1100° C.

Further, the p-AlGaN layer 57 with a thickness of about not less than 15 nm and not more than 30 nm in the p-type gallium nitride-based semiconductor layer 53, as in the second variation shown in FIG. 5C, can reduce overflow of electrons during operation.

Next, as shown in FIG. 5A, after the formation of the p-type gallium nitride-based semiconductor 53, a stacking semiconductor structure including the n-type gallium nitride-based semiconductor 41 epitaxially grown on the substrate, the gallium nitride-based semiconductor active layer 52, and the p-type gallium nitride-based semiconductor 53, is subjected to heat treatment for about 20 minutes at a temperature of about not less than 800° C. and not more than 900° C.

Next, the stacking semiconductor structure is dry-etched using a chlorine gas to remove part of each of the p-type gallium nitride-based semiconductor 53, the gallium nitride-based semiconductor active layer 52, and the n-type gallium nitride-based semiconductor 41 and form a recess, thereby exposing part of the n-type gallium nitride-based semiconductor 41. As a result, a plane other than the c-plane, e.g., a plane tilted at the angle of not less than 18° and not more than 90° with respect to the c-plane, appears on the surface. This plane is m-plane, a-plane, +r-plane, -r-plane, S-plane, n-plane, R-plane, (11-22) plane, (20-21) plane, (10-13) plane, (20-2-1) plane, or (10-1-3) plane.

Next, the exposed surface of the n-type gallium nitride-based semiconductor 41 is exposed to an oxygen plasma atmosphere, for example, to modify the exposed portion of the surface of the n-type gallium nitride-based semiconductor 41. As a result, the hydrophilicity (wettability) of the exposed portion of the surface of the n-type gallium nitride-based semiconductor 41 is increased. After that, the metal layer 42 is formed on and in contact with the exposed portion of the n-type gallium nitride-based semiconductor 41. As the metal layer 42, a layer containing Ag or Al or both of Ag and Al is formed, for example.

Subsequently, the p-side electrode 54 is formed on and in contact with the surface of the p-type gallium nitride-based semiconductor 53. For example, a Pd/Pt layer or an Mg/Ag layer can be used as the p-side electrode 54. After that, heat treatment is performed to cause alloying of the metal layer 42 and the n-type gallium nitride-based semiconductor 41, and cause alloying of the p-side electrode 54 and the p-type gallium nitride-based semiconductor 53. The order of formation of the metal layer 42 to be an n-side electrode and the p-side electrode 54 is not specifically decided.

After that, the lower surface of the substrate 51 is ground to a thickness of about 50 μm to 300 μm to reduce the thickness of the substrate 51. The thickness reduction of the substrate 51 not only leads to easy dicing of the substrate 51, but also achieves a reduction in light that is absorbed in the nitride semiconductor light-emitting device 55.

The thus obtained nitride semiconductor light-emitting device 55 is divided into chips by dicing, and each of the chips is mounted on a mount substrate that is a substrate formed of alumina (aluminum oxide), aluminum nitride (AlN), or resin. Further, in the case where silicon (Si) or germanium (Ge), is used as the mount substrate, a mount surface of the mount substrate can be covered with an insulating film. An interconnect can be arranged according to the shape of the electrode of the nitride semiconductor light-emitting device 55. Cu, Au, Ag, or Al can be used as the interconnect. These materials can be applied onto the mount substrate by sputtering method or plating method.

Third Embodiment

A gallium nitride-based semiconductor light-emitting device of the third embodiment will be described below with reference to FIG. 6A.

Figure 6A:
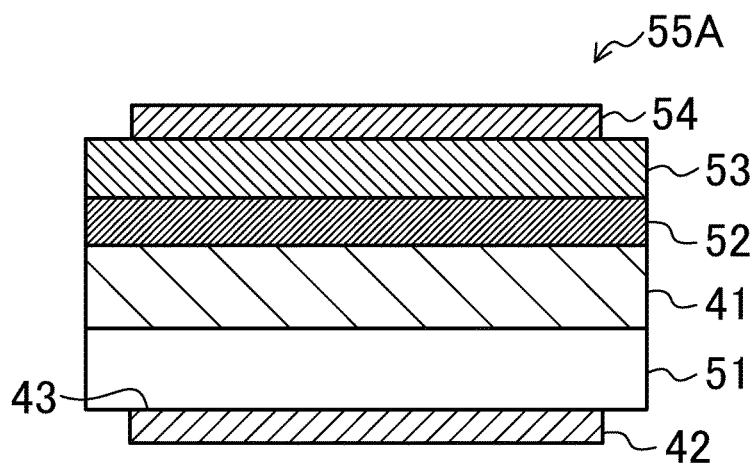
FIG. 6A is a cross-sectional view of a gallium nitride-based semiconductor light-emitting device of the third embodiment.

FIG. 6A shows a cross-sectional structure of a gallium nitride-based semiconductor light-emitting device 55A of the third embodiment, which is formed on a gallium nitride-based semiconductor having a nonpolar plane or a semi-polar plane as a growth surface.

In the present embodiment, a substrate 51 is formed of n-type GaN having a surface in a plane orientation in which effective surface modification can be made. For example, an upper surface and a lower surface which are growth surfaces of the substrate 51 are crystal planes other than the c-plane, and may be crystal planes tilted at the angle of not less than 18° and not more than 90° with respect to the c-axis, and may be m-plane, a-plane, +r-plane, -r-plane, S-plane, n-plane, R-plane, (11-22) plane, (20-21) plane, (10-13) plane, (20-2-1) plane, or (10-1-3) plane.

In the third embodiment, a metal layer 42 is provided on a surface of the substrate 51 to be opposite to the n-type gallium nitride-based semiconductor 41. The metal layer 42 and the substrate 51 have an interface 43. Further, the metal layer 42 which is an n-side electrode serves as a reflector. A transparent electrode is used as the p-side electrode 54.

(First Variation of Third Embodiment)

Figure 6B:
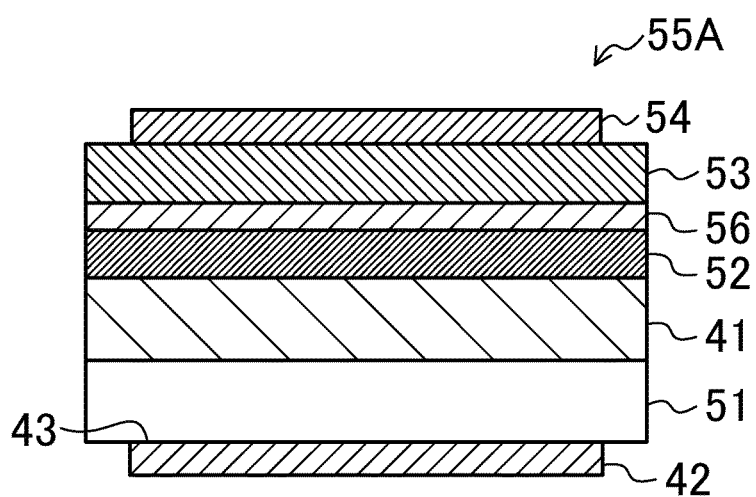
FIG. 6B is a cross-sectional view of a gallium nitride-based semiconductor light-emitting device of the first variation of the third embodiment.

As the first variation, an undoped GaN layer 56 may be formed between the gallium nitride-based semiconductor active layer 52 and the p-type gallium nitride-based semiconductor 53, as in the nitride semiconductor light-emitting device 55A shown in FIG. 6B.

(Second Variation of Third Embodiment)

Figure 6C:
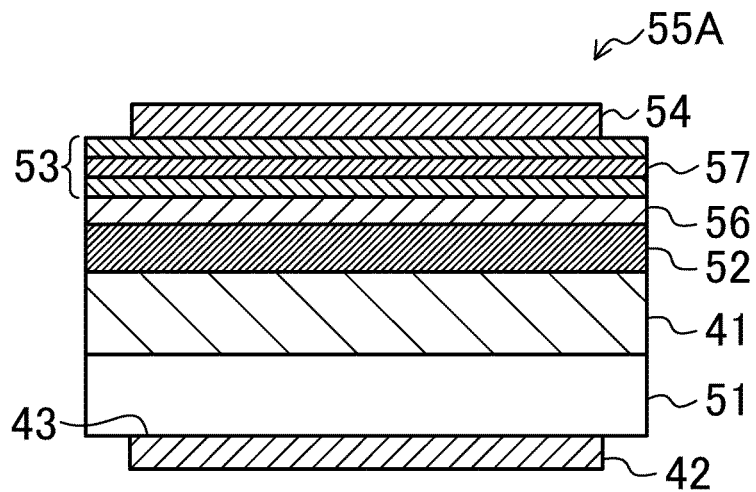
FIG. 6C is a cross-sectional view of a gallium nitride-based semiconductor light-emitting device of the second variation of the third embodiment.

Further, as the second variation, the p-AlGaN layer 57 may be formed in the p-type gallium nitride-based semiconductor 53, as in the nitride semiconductor light-emitting device 55A shown in FIG. 6C. The p-AlGaN layer 57 provided in the p-type gallium nitride-based semiconductor 53 can reduce overflow of electrons injected during the operation of the light-emitting element.

(Manufacturing Method)

In the third embodiment, the nitride-based semiconductor light-emitting device 55A having a crystal plane, other than the c-plane, as a growth surface is manufactured.

Similar to the second embodiment, an n-type gallium nitride-based semiconductor 41, a gallium nitride-based semiconductor active layer 52, and a p-type gallium nitride-based semiconductor 53 are epitaxially grown by MOCVD method, sequentially on a growth surface of the substrate 51 having a GaN layer which has a crystal plane, other than the c-plane, as a growth surface. After that, heat treatment is performed at a temperature about not less than 800° C. and not more than 900° C. for about 20 minutes.

In the first variation, as shown in FIG. 6B, an undoped GaN layer 56 equivalent to the undoped GaN layer 56 of the second embodiment is formed on the gallium nitride-based semiconductor active layer 52. Thus, the p-type gallium nitride-based semiconductor 53 is formed on the undoped GaN layer 56.

In the second variation, as shown in FIG. 6C, the p-AlGaN layer 57 equivalent to the p-AlGaN layer 57 of the second embodiment is formed in the p-type gallium nitride-based semiconductor 53.

Next, in a manner similar to the second embodiment, the lower surface of the substrate 51 is ground to reduce the thickness. A ground surface of the substrate 51 of which the thickness has been reduced may be a plane tilted within ±5° with respect to any one of m-plane, a-plane, +r-plane, −r-plane, S-plane, n-plane, R-plane, (11-22) plane, (20-21) plane, (10-13) plane, (20-2-1) plane, and (10-1-3) plane. Subsequently, the ground surface is exposed to an oxygen plasma atmosphere, for example, thereby modifying the ground surface of the substrate 51 and increasing the hydrophilicity of the ground surface. After that, a metal layer 42 is formed to be in contact with part of the ground surface of the substrate 51. As the metal layer 42, a layer containing Ag or Al or both of Ag and Al is formed, for example. In a manner similar to the second embodiment, the metal layer 42 may be an alloy of Ag and Al, or may have a stacking structure of an Ag single layer and an Al single layer, either of which is brought into contact with the ground surface of the substrate 51.

Subsequently, the p-side electrode 54 is formed on and in contact with the surface of the p-type gallium nitride-based semiconductor 53. As the p-side electrode 54, a Pd/Pt layer or an Mg/Ag layer having a thickness which allows transmission of light, or an indium tin oxide (ITO) electrode, etc., which transmits light, is formed. After that, heat treatment is performed to cause alloying of a connecting portion between the metal layer 42 and the substrate 51, and a connecting portion between the p-side electrode 54 and the p-type gallium nitride-based semiconductor 53.

The thus obtained nitride semiconductor light-emitting device 55A is divided into chips by dicing, and each of the chips is mounted on a mount substrate thereafter.

EXAMPLES

First Example

As the first example, two m-plane GaN substrates were prepared, and upper and lower surfaces of each of the two substrates were polished to mirror surfaces. Subsequently, one of the two substrates was subjected to organic cleaning, and was thereafter cleaned with buffered HF (BHF). The other substrate was exposed to an oxygen plasma atmosphere to modify its surface. Oxygen plasma was generated using a high density plasma etching apparatus (NE-500) of an inductively-coupled discharge type that was produced by ULVAC, Inc., under process condition of antenna power of 500 W and bias power of 30 W. Further, an oxygen flow rate was set to 20 ml/min (0° C., 1 atmospheric pressure), and a pressure was set to 0.6 Pa, with the process time of 30 seconds. After that, an aluminum (Al) layer having a thickness of 500 nm was formed on a principal plane of each of the two substrates by electron beam evaporation method. As a result, the structure shown in FIG. 4 was manufactured.

Next, a resist solution was applied onto the Al layer, and a transmission line model (TLM) pattern was formed in the resist film using an exposure apparatus and developer. Subsequently, the TLM pattern was transferred to the Al layer using Al etchant, and the resist film was removed by organic cleaning. As a result, TLM patterns formed in two types of Al layers were manufactured.

Figure 7A:
FIG. 7A shows a structure of a comparative example of the first example, and is an optical microscope image of a surface of an Al layer before heat treatment.
Figure 8A:
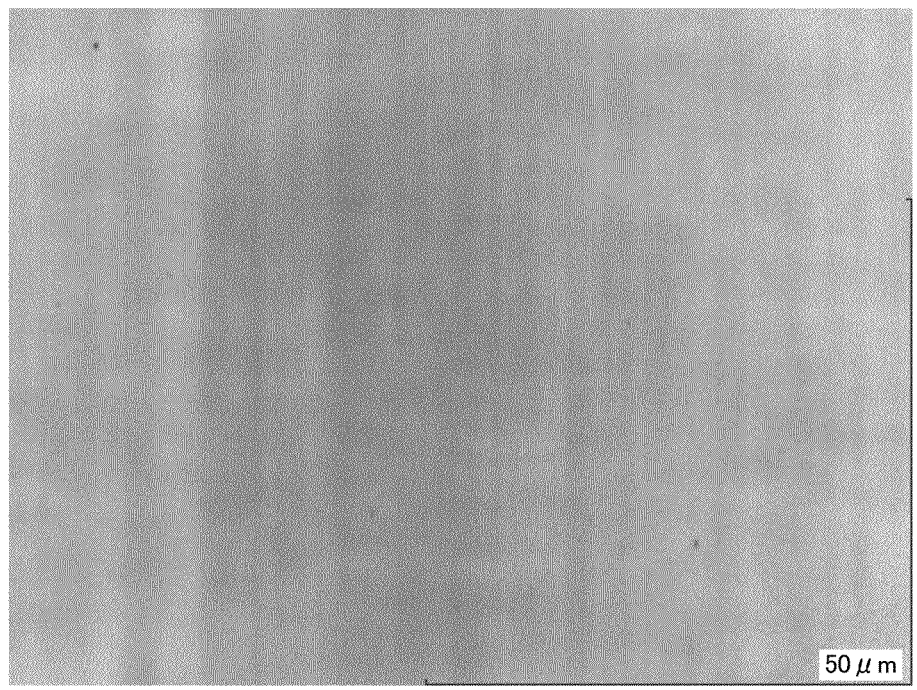
FIG. 8A is a structure of a comparative example of the first example, and is an optical microscope image of an interface between an m-plane n-type GaN layer and an Al layer before heat treatment.
Figure 9A:
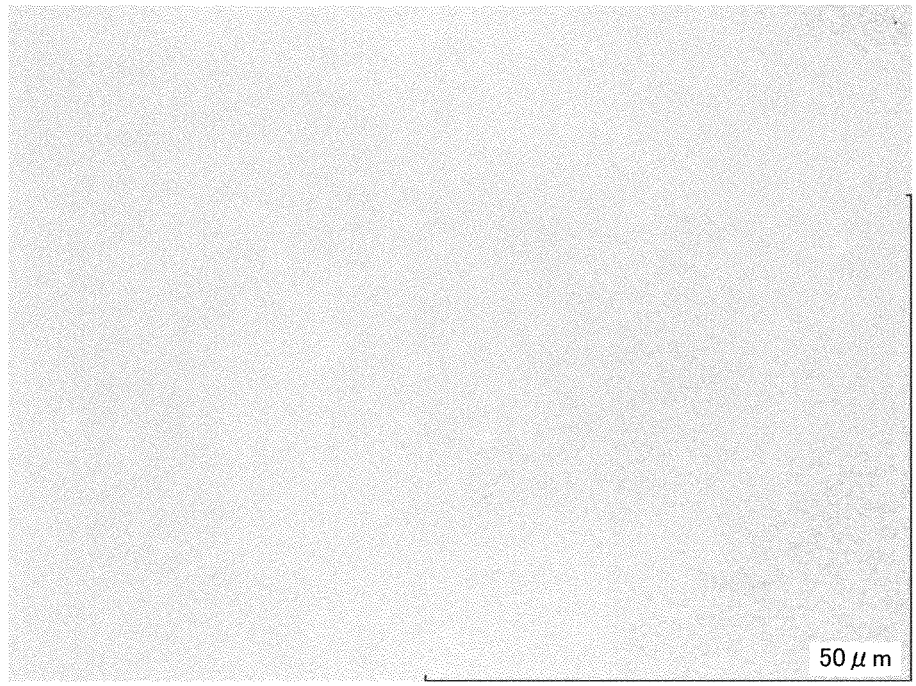
FIG. 9A shows a structure including a gallium nitride-based semiconductor layer and a metal layer of the first example, and is an optical microscope image of a surface of the Al layer before heat treatment.
Figure 10A:
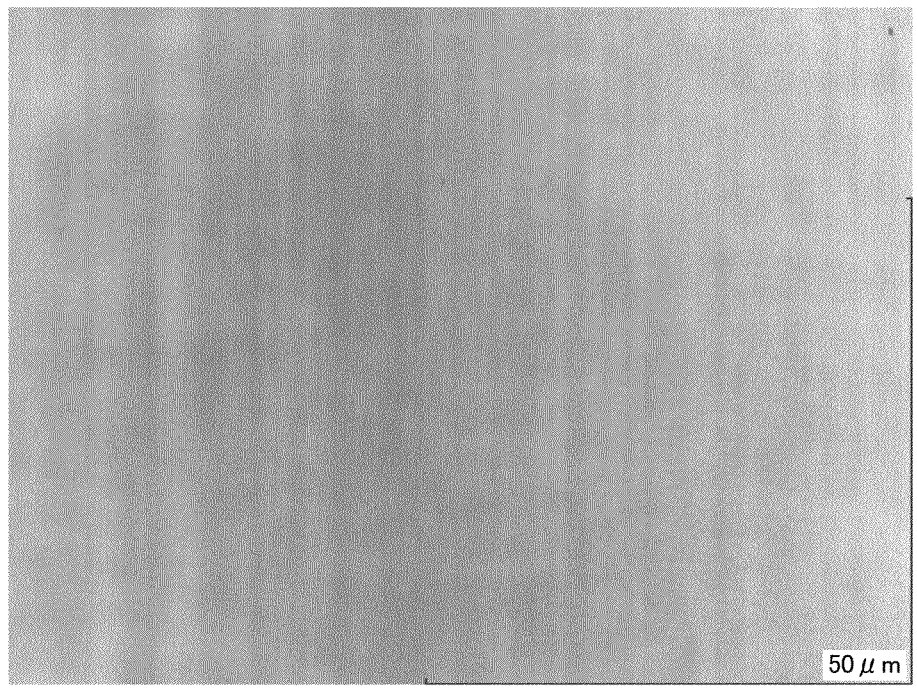
FIG. 10A shows a structure including a gallium nitride-based semiconductor layer and a metal layer of the first example, and is an optical microscope image of an interface between an m-plane n-type GaN layer and an Al layer before heat treatment.

Each of the Al layers thus manufactured was observed with an optical microscope before heat treatment, and the results are shown in FIG. 7A, FIG. 8A, FIG. 9A, and FIG. 10A. FIG. 7A is a comparative example, showing an optical microscope image of a surface of an Al layer before heat treatment which was formed on an unmodified surface of an m-plane n-type GaN. FIG. 8A is a comparative example, showing an optical microscope image of an interface, before heat treatment, of an Al layer with an unmodified surface of an m-plane n-type GaN on which the Al layer was formed, and the image was observed from an m-plane n-type GaN side. FIG. 9A is the inventive example, showing an optical microscope image of a surface of the Al layer before heat treatment which was formed on a modified surface of the m-plane n-type GaN. FIG. 10A is the inventive example, showing an optical microscope image of a surface of an interface, before heat treatment, of the Al layer with a modified surface of the m-plane n-type GaN on which the Al layer was formed, and the image was observed from an m-plane n-type GaN side.

Although there are a lot of uneven portions in the Al surface of FIG. 7A, all of the images show that relatively planar Al surface and Al—GaN interface were manufactured at a point before heat treatment.

Figure 7B:
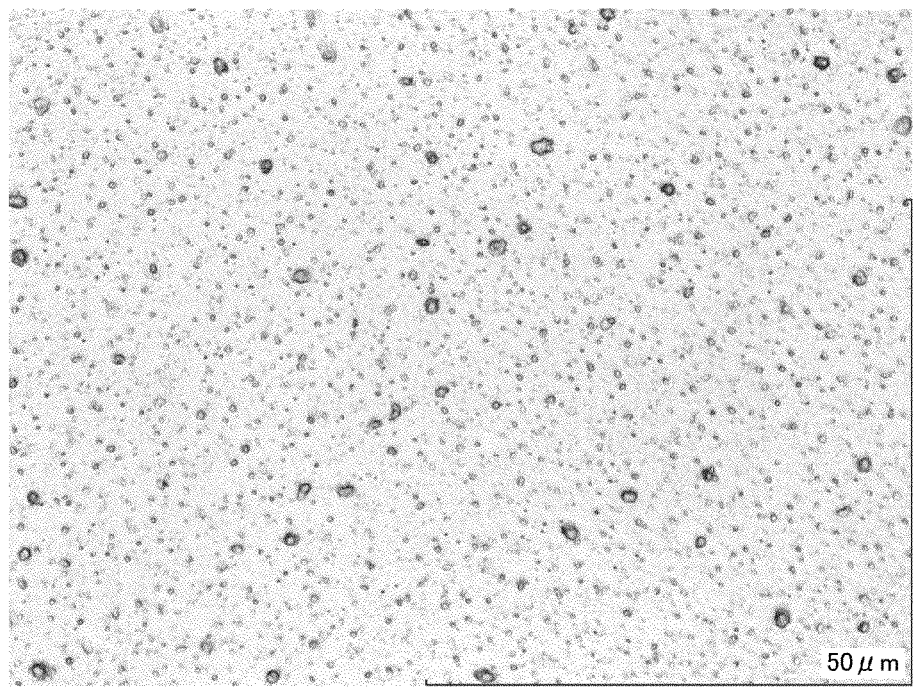
FIG. 7B shows a structure of a comparative example of the first example, and is an optical microscope image of the surface of the Al layer after heat treatment.
Figure 8B:
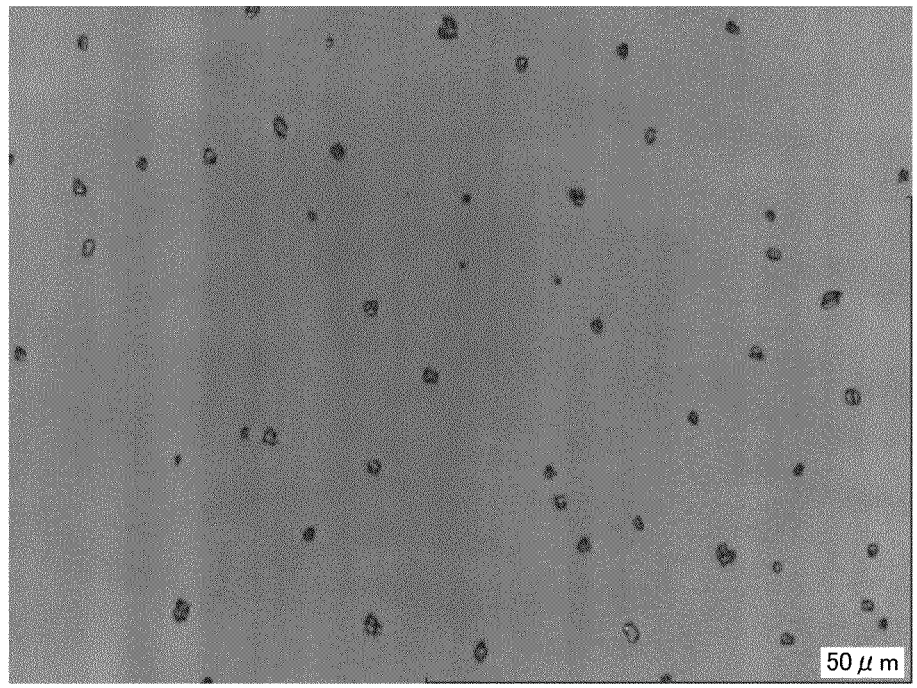
FIG. 8B shows a structure of a comparative example of the first example, and is an optical microscope image of an interface between m-plane n-type GaN and an Al layer after heat treatment.

On the other hand, optical microscope images of the above two samples which were subjected to heat treatment in an nitrogen ($N_2$) atmosphere for 10 minutes at a temperature of 500° C. are shown in FIG. 7B, FIG. 8B, FIG. 9B, and FIG. 10B. FIG. 7B is a comparative example, showing an optical microscope image of a surface of an Al layer after heat treatment which was formed on an unmodified surface of an m-plane n-type GaN. FIG. 8B is a comparative example, showing an optical microscope image of an interface, after heat treatment, of an Al layer with an unmodified surface of an m-plane n-type GaN on which the Al layer was formed, and the image was observed from an m-plane n-type GaN side.

Figure 9B:
FIG. 9B shows a structure of the first example, and is an optical microscope image of the surface of the Al layer after heat treatment.
Figure 10B:
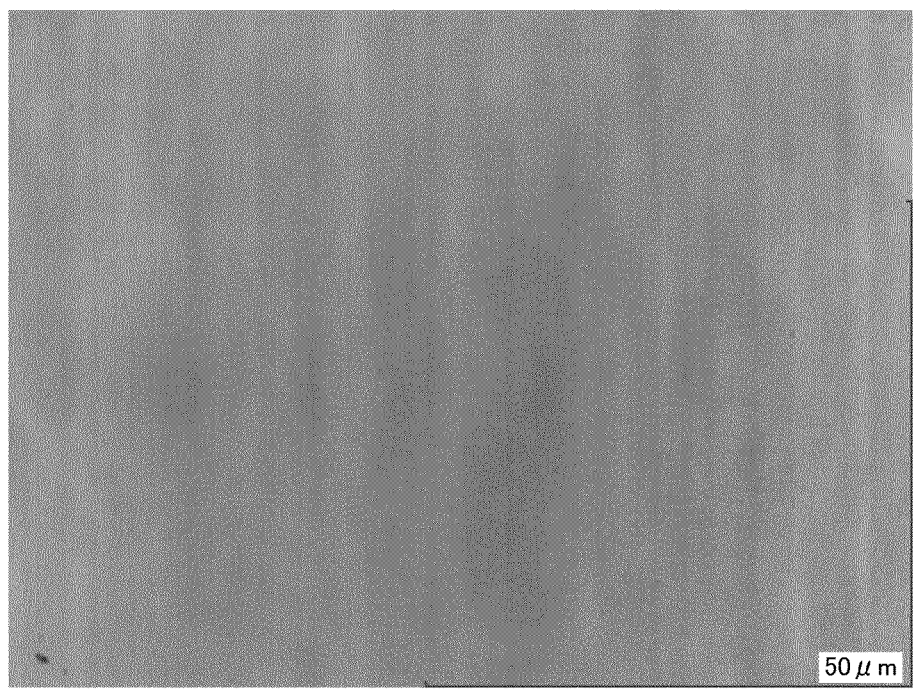
FIG. 10B shows a structure of the first example, and is an optical microscope image of an interface between an m-plane n-type GaN layer and an Al layer after heat treatment.

FIG. 9B is the inventive example, showing an optical microscope image of a surface of the Al layer after heat treatment which was formed on a modified surface of the m-plane n-type GaN. FIG. 10B is the inventive example, showing an optical microscope image of an interface, after heat treatment, of the Al layer with a modified surface of the m-plane n-type GaN on which the Al layer was formed, and the image was observed from an m-plane n-type GaN side. According to these images, the samples with unmodified surfaces have a lot of uneven portions not only in the Al—GaN interface, but also in the Al surface, as shown in FIGS. 7A-7B and FIGS. 8A-8B, whereas in the samples with modified surfaces, the Al—GaN interface and the Al surface are as planar as those of the samples before heat treatment, as shown in FIGS. 9A-9B and FIGS. 10A-10B. It is known from this that the Al layer formed on the modified surface of the n-type GaN is firmly connected to the GaN layer, and is therefore strong against disturbances, such as heat.

Figure 11:
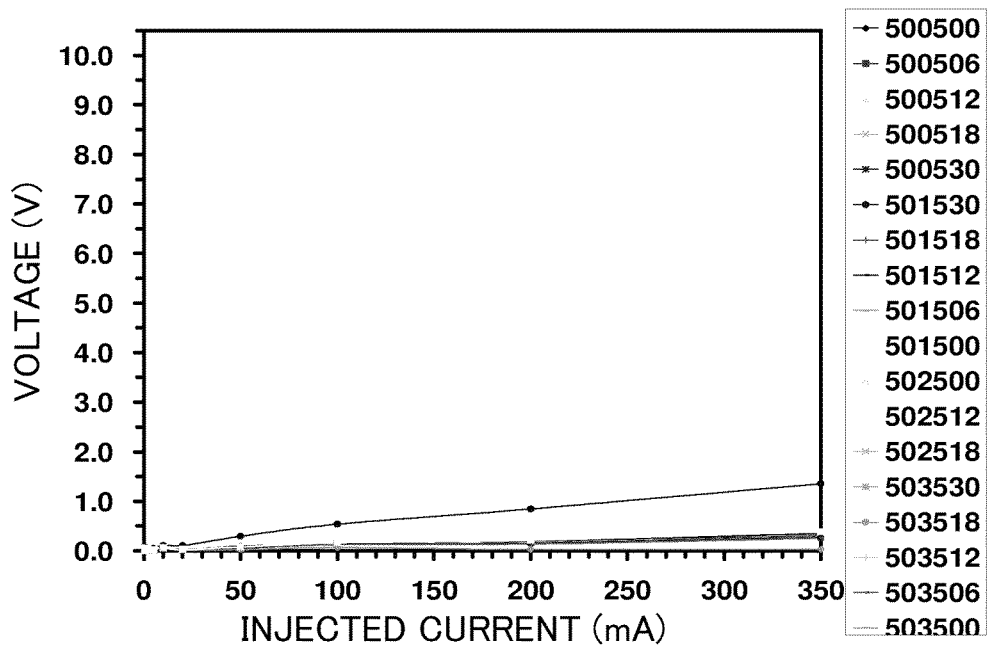
FIG. 11 is a graph showing the current-voltage characteristics of a structure including a gallium nitride-based semiconductor layer and a metal layer of a comparative example of the first example.
Figure 12:
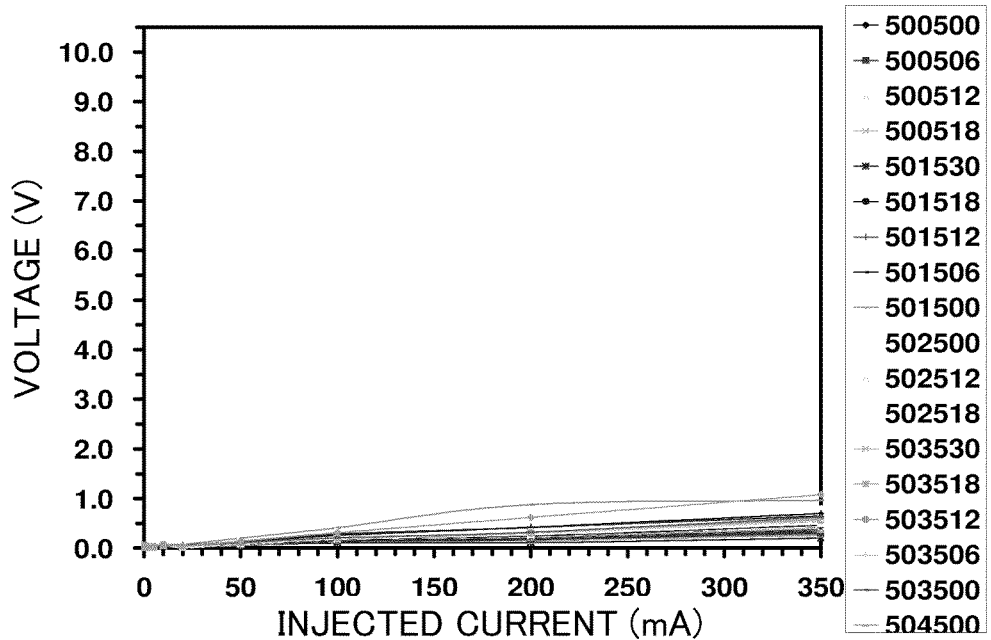
FIG. 12 is a graph showing the current-voltage characteristics of a structure including a gallium nitride-based semiconductor layer and a metal layer of the first example.

Next, results of evaluation of current-voltage (1-V) characteristics of the above two samples are shown in FIG. 11 and FIG. 12. FIG. 11 relates to a comparative example, showing a result of I-V measurement of an Al layer which was formed on an unmodified surface of an m-plane n-type GaN and was given a pattern. FIG. 12 relates to the inventive example, showing a result of I-V measurement of the Al layer which was formed on a modified surface of the m-plane n-type GaN and was given a pattern. The results show that the Al layer on the modified surface of the n-type GaN shown in FIG. 12 exhibits similar electrical characteristics as the Al layer on the unmodified surface of the n-type GaN shown in FIG. 11. It is known from this that the Al layer on the modified surface of the n-type GaN also exhibits a low contact resistance with respect to the GaN layer.

Second Example

As the second example, two m-plane n-type GaN substrates were prepared, and upper and lower surfaces of each of the two substrates were polished to mirror surfaces. Subsequently, one of the two substrates was subjected to organic cleaning, and was thereafter cleaned with buffered HF (BHF). The other substrate was exposed to an oxygen plasma atmosphere to modify its surface. Oxygen plasma was generated using a high density plasma etching device (NE-500) of an inductively-coupled discharge type that was produced by ULVAC, Inc., under process condition of antenna power of 500 W and bias power of 30 W. Further, an oxygen flow rate was set to 20 ml/min (0° C., 1 atmospheric pressure), and a pressure was set to 0.6 Pa, with the process time of 30 seconds. After that, a silver (Ag) layer having a thickness of 500 nm was formed on a principal plane of each of the two substrates by electron beam evaporation method. As a result, the structure shown in FIG. 4 was manufactured.

Next, a resist solution was applied onto the Ag layer, and a TLM pattern was formed in the resist film using an exposure device and developer. Subsequently, the TLM pattern was transferred to the Ag layer using Ag etchant, and the resist film was removed by organic cleaning. As a result, TLM patterns formed in two types of Al layers were manufactured.

Figure 13:
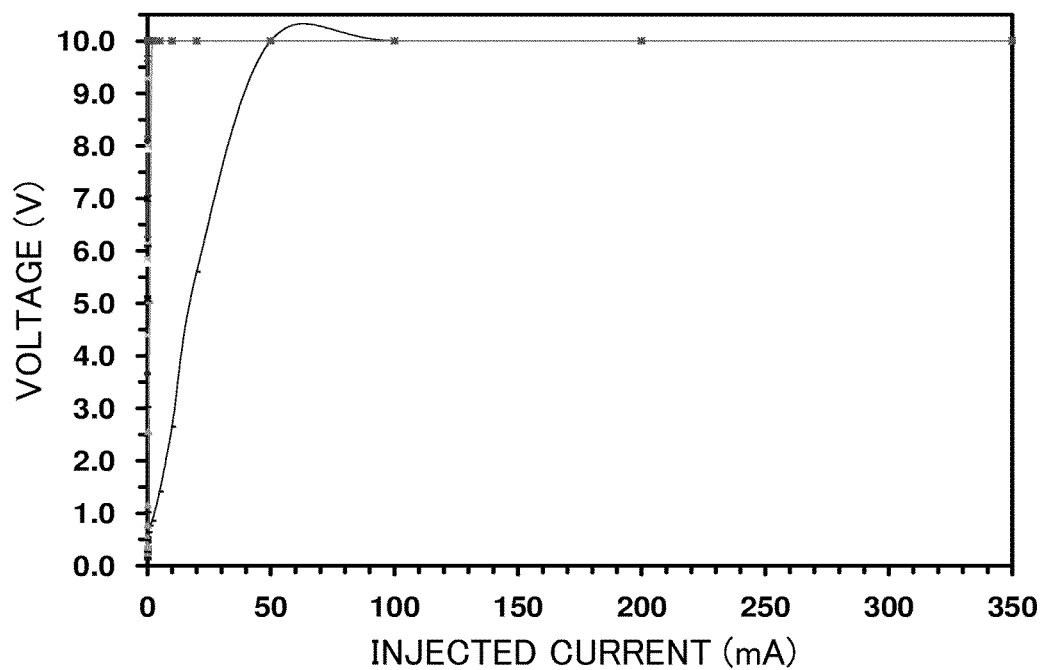
FIG. 13 is a graph showing the current-voltage characteristics of a structure including a gallium nitride-based semiconductor layer and a metal layer of a comparative example of the second example.
Figure 14:
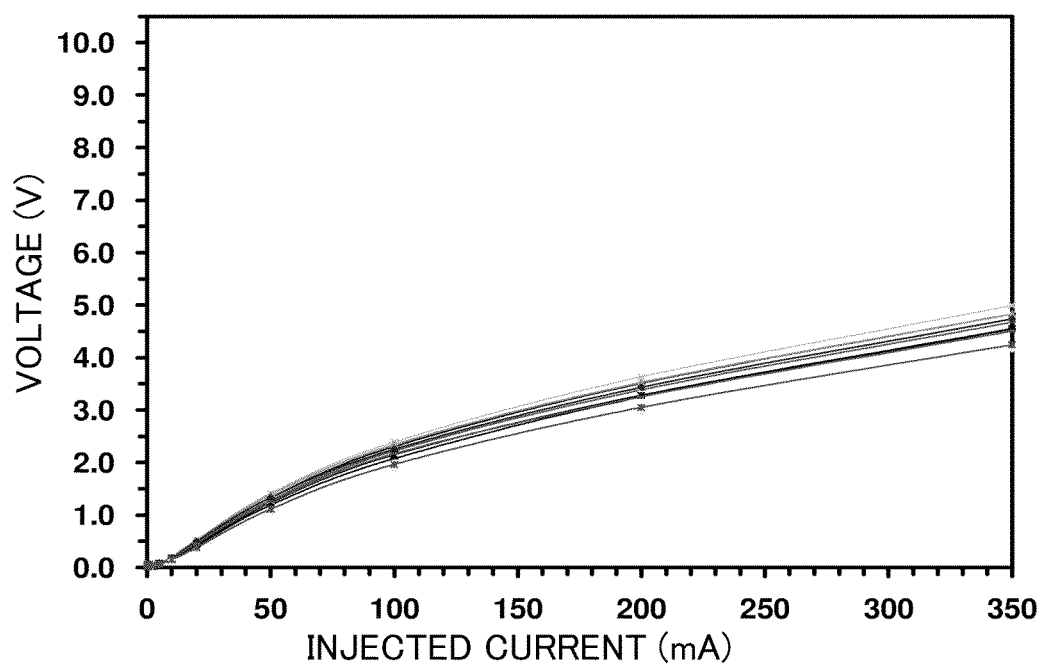
FIG. 14 is a graph showing the current-voltage characteristics of a structure including a gallium nitride-based semiconductor layer and a metal layer of the second example.

Results of evaluation of current-voltage (1-V) characteristics of the above two samples are shown in FIG. 13 and FIG. 14. FIG. 13 relates to a comparative example, showing a result of I-V measurement of an Ag layer which was formed on an unmodified surface of an m-plane n-type GaN and was given a pattern. FIG. 14 relates to the inventive example, showing a result of I-V measurement of the Ag layer which was formed on a modified surface of the m-plane n-type GaN and was given a pattern. The results show that an ohmic contact cannot be formed with the Ag layer on the unmodified surface of the n-type GaN shown in FIG. 13, whereas the Ag layer on the modified surface of the n-type GaN exhibits good electrical characteristics, that is, an ohmic contact was formed. This means that the Ag layer which, in general, cannot be used as an electrode of a gallium nitride-based semiconductor, can be used on the n-type GaN by modifying the surface of the n-type GaN.

Figure 15:
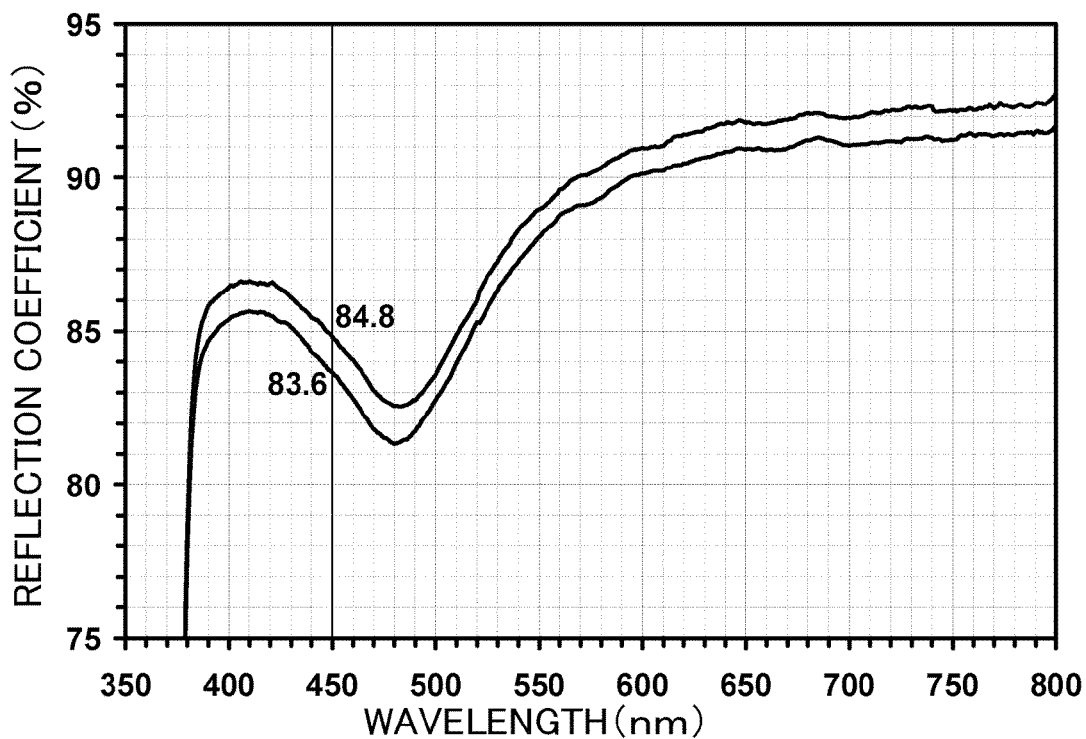
FIG. 15 is a graph relating to a comparative example of the second example, and shows measurement results of an interface reflection coefficient between an m-plane n-type GaN layer and an Ag layer after heat treatment.
Figure 16:
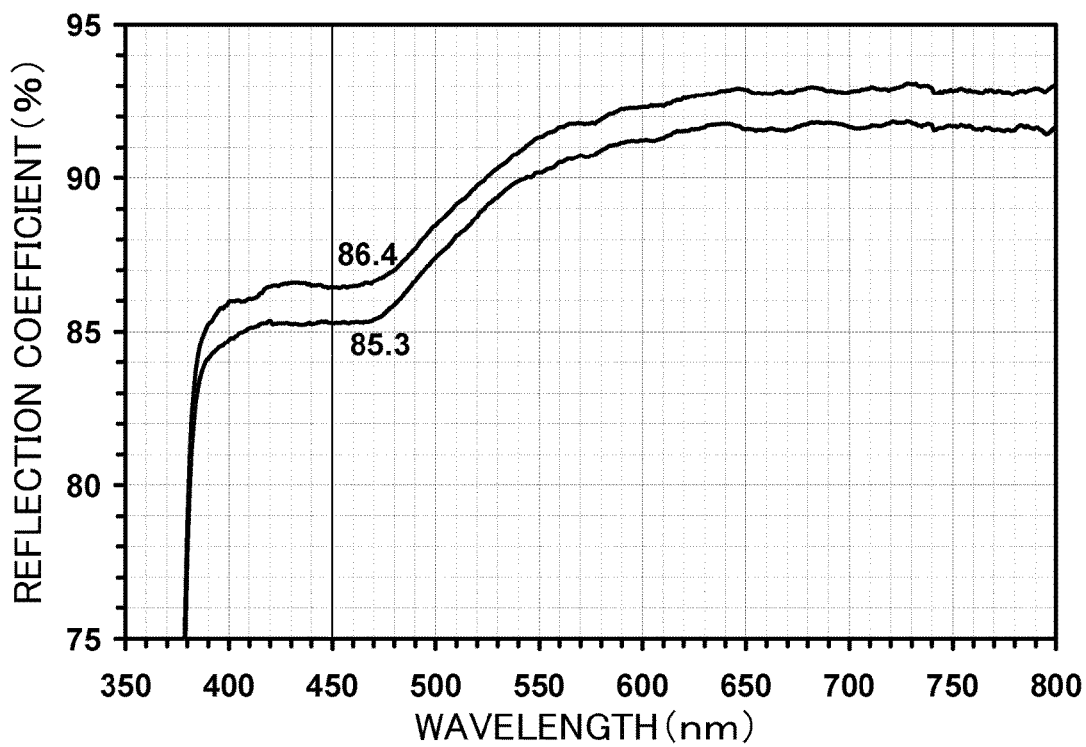
FIG. 16 is a graph relating to a structure of the second example including a gallium nitride-based semiconductor layer and a metal layer, and shows measurement results of the interface reflection coefficient between an m-plane n-type GaN layer and an Ag layer after heat treatment.

Next, results of measurement of reflection coefficients of the above two samples after heat treatment in a nitrogen atmosphere for 20 minutes at a temperature of 500° C., are shown in FIG. 15 and FIG. 16. FIG. 15 relates to a comparative example, showing a result of measurement of a reflection coefficient of an interface, after heat treatment, of an Ag layer with an unmodified surface of an m-plane n-type GaN on which the Ag layer was formed, and the measurement was performed from the m-plane n-type GaN side. FIG. 16 relates to the inventive example, showing a result of measurement of a reflection coefficient of an interface, after heat treatment, of the Ag layer with a modified surface of the m-plane n-type GaN on which the Ag layer was formed, and the measurement was performed from the m-plane n-type GaN side. As a measurement device, an ultraviolet visible spectrophotometer (V-570) manufactured by JASCO Corporation into which an absolute reflection coefficient measurement apparatus (ARN-475) was incorporated was used. In the measurement, a GaN substrate with its both surfaces polished, was irradiated with light with a wavelength of from 350 nm to 800 nm from a mirror surface side on which an Ag layer was not formed, and the light reflected by the interface between the GaN substrate and the Ag layer was received on the mirror surface side on which the Ag layer was not formed. In the comparative example where the surface was not modified, surface plasmon resonance (SPR) absorption due to generation of Ag nanoparticles was observed in a wavelength range of from 450 nm to 500 nm as shown in FIG. 15. However, in the inventive example where the surface was modified, almost no SPR absorption was observed as shown in FIG. 16, from which it is known that the Ag layer on the modified surface of the n-type GaN is firmly connected to the GaN layer and is strong against disturbances, such as heat, and therefore that generation of nanoparticles is not promoted.

Next, optical microscope images of the above two samples before and after heat treatment in a nitrogen atmosphere for 20 minutes at a temperature of 500° C. are shown in FIG. 17A, FIG. 17B, FIG. 18A, and FIG. 18B.

Figure 17A:
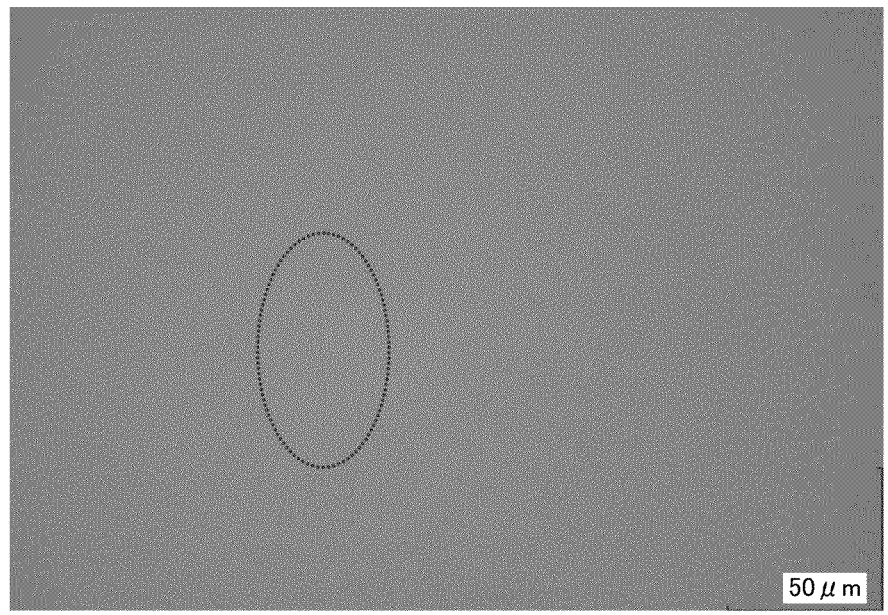
FIG. 17A shows a structure of a comparative example of the second example, and is an optical microscope image of an interface between an m-plane n-type GaN layer and an Al layer before heat treatment.
Figure 17B:
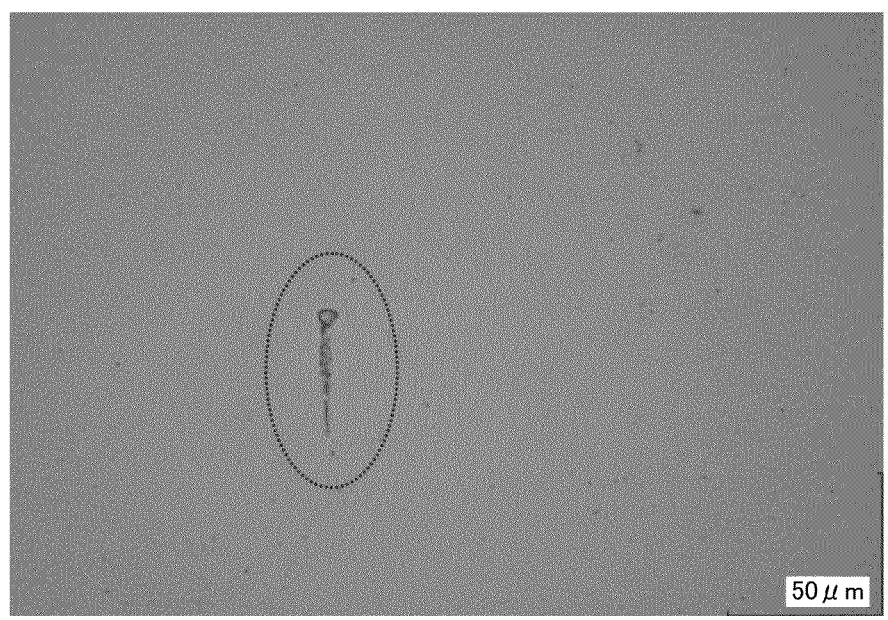
FIG. 17B shows a structure of a comparative example of the second example, and is an optical microscope image of an interface between an m-plane n-type GaN layer and an Al layer after heat treatment.
Figure 18A:
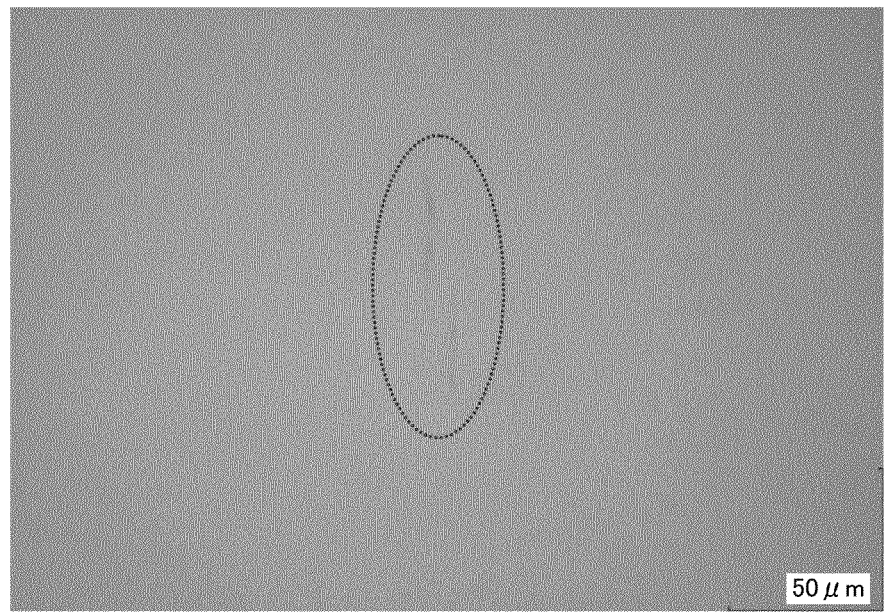
FIG. 18A shows a structure of the second example including a gallium nitride-based semiconductor layer and a metal layer, and is an optical microscope image of an interface between an m-plane n-type GaN layer and an Al layer before heating.
Figure 18B:
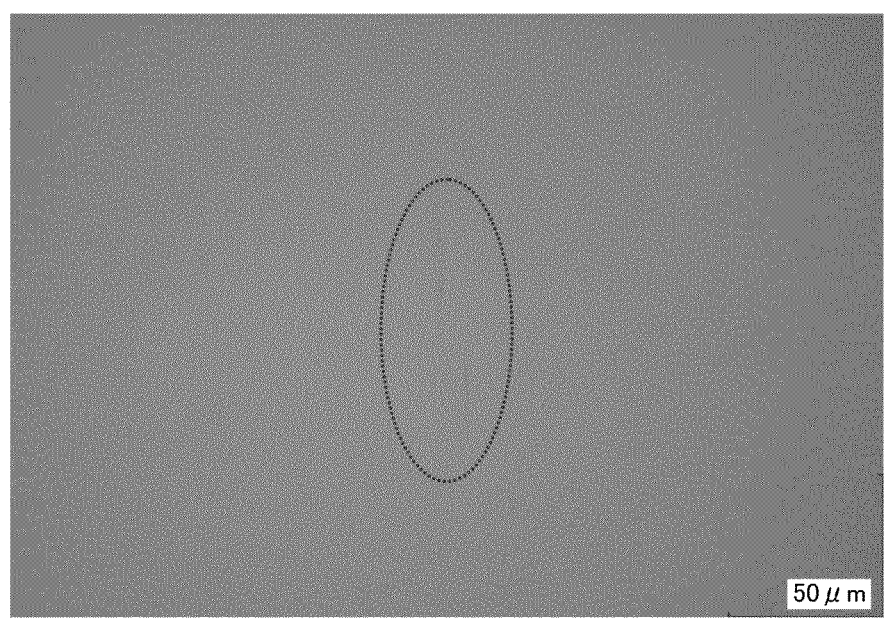
FIG. 18B shows a structure of the second example, and is an optical microscope image of an interface between an m-plane n-type GaN layer and an Al layer after heat treatment.

FIG. 17A is a comparative example, showing an optical microscope image of an interface, before heat treatment, of an Ag layer with an unmodified surface of an m-plane n-type GaN on which the Ag layer was formed, and the image was observed from the m-plane n-type GaN side. FIG. 17B is a comparative example, showing an optical microscope image of an interface, after heat treatment, of an Ag layer with an unmodified surface of an m-plane n-type GaN on which the Ag layer was formed, and the image was observed from the m-plane n-type GaN side. FIG. 18A is the inventive example, showing an optical microscope image of an interface, before heat treatment, of the Ag layer with a modified surface of the m-plane n-type GaN on which the Ag layer was formed, and the image was observed from the m-plane n-type GaN side. FIG. 18B is the inventive example, showing an optical microscope image of an interface, after heat treatment, of the Ag layer with a modified surface of the m-plane n-type GaN on which the Ag layer was formed, and the image was observed from the m-plane n-type GaN side. According to these images, the sample with the unmodified surface has uneven portions in the Ag—GaN interface, as shown in FIG. 17B, whereas in the sample with modified surface, the Ag—GaN interface is as planar as that of the sample before heat treatment, as shown in FIG. 18B. It is known from this that the Ag layer on the modified surface of the n-type GaN is firmly connected to the GaN layer, and is therefore strong against disturbances, such as heat.

Figure 19:
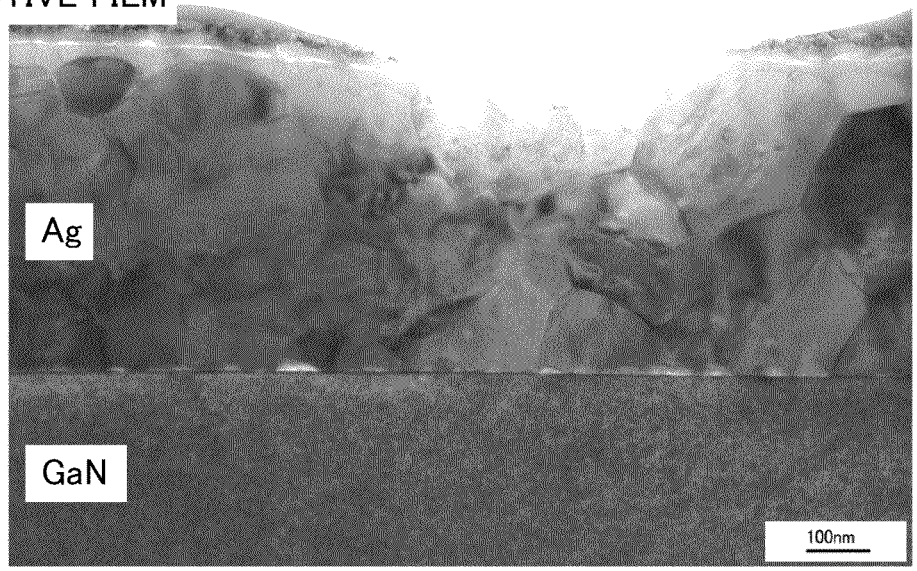
FIG. 19 shows a structure of a comparative example of the second example, and is a cross-sectional transmission electron microscope (TEM) image of an interface between an m-plane n-type GaN layer and an Ag layer after heat treatment.
Figure 20:
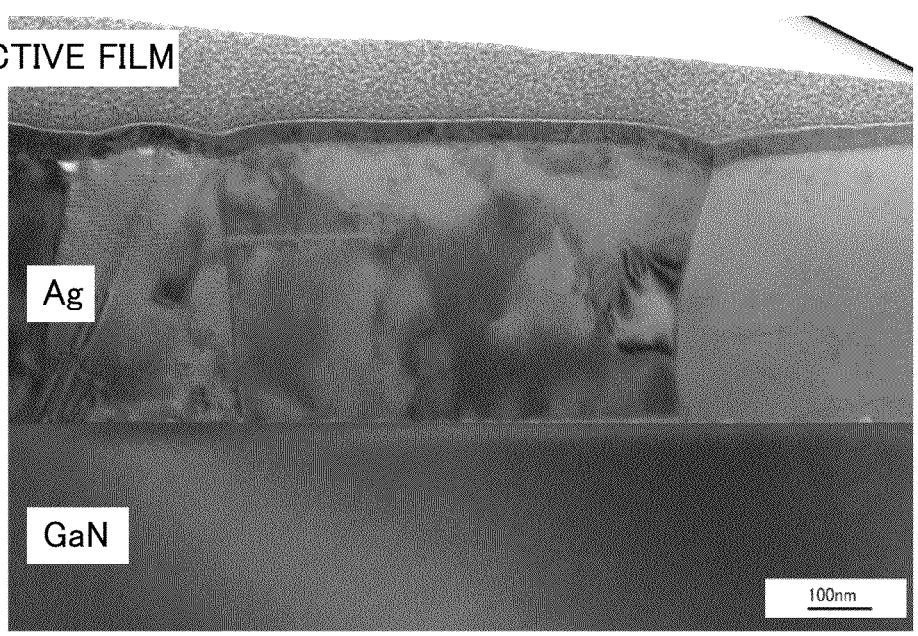
FIG. 20 shows a structure of the second example including a gallium nitride-based semiconductor layer and a metal layer, and is a cross-sectional TEM image of an interface between an m-plane n-type GaN layer and an Ag layer after heat treatment.
Figure 21:
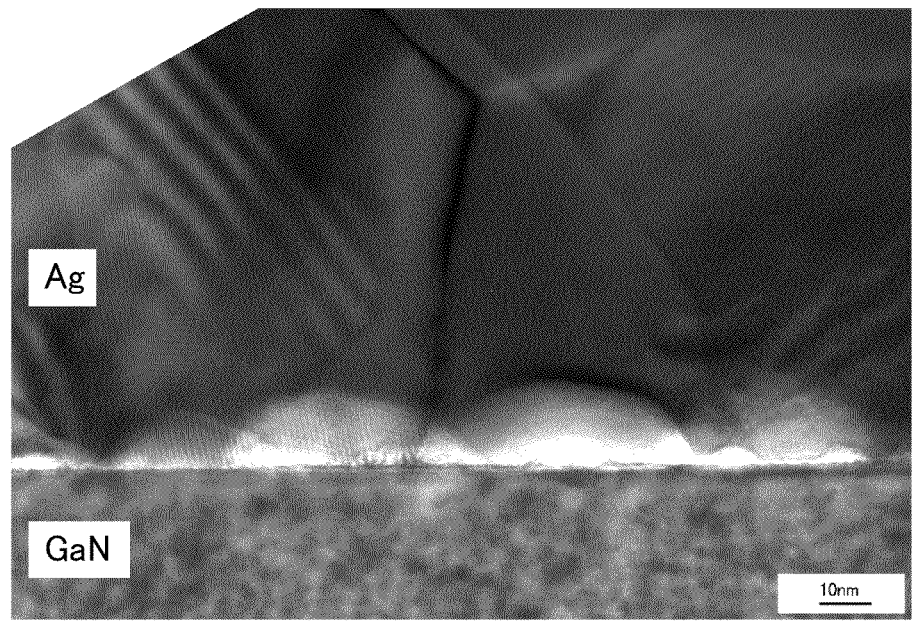
FIG. 21 shows a structure of a comparative example of the second example, and is a cross-sectional transmission electron microscope (TEM) image of an interface between an m-plane n-type GaN layer and an Ag layer after heat treatment.
Figure 22:
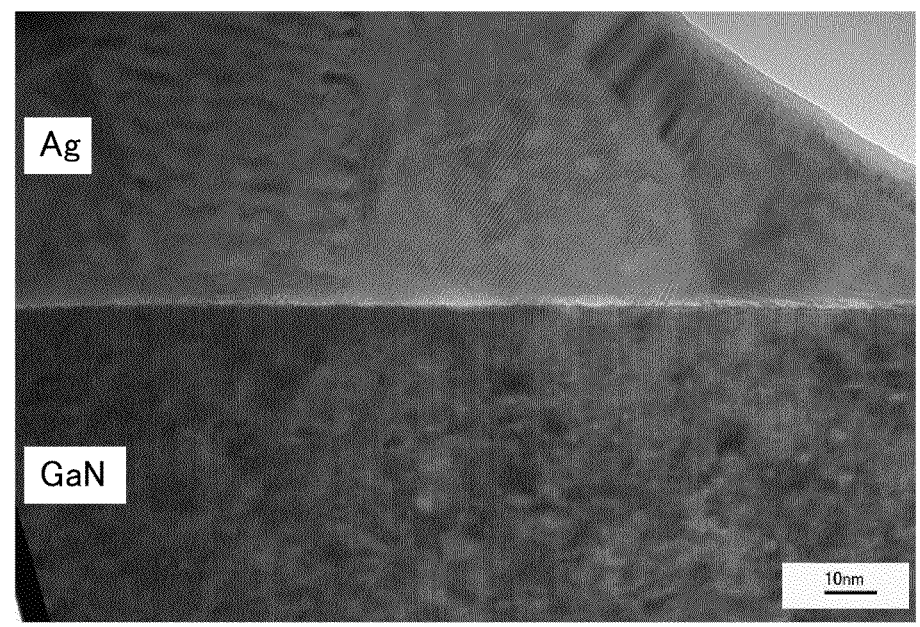
FIG. 22 shows a structure of the second example including a gallium nitride-based semiconductor layer and a metal layer, and is a cross-sectional TEM image of an interface between an m-plane n-type GaN layer and an Ag layer after heat treatment.
Figure 23:
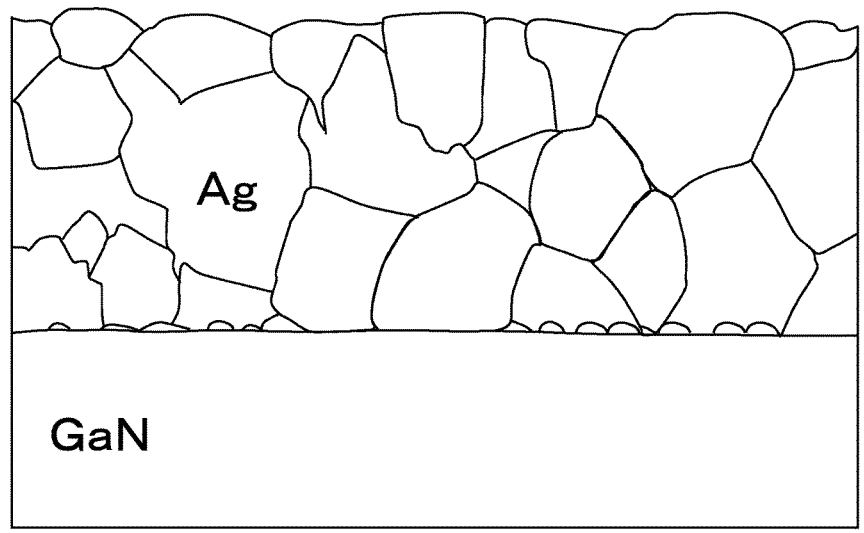
FIG. 23 is a cross-sectional view schematically showing the cross-sectional TEM image of FIG. 19.
Figure 24:
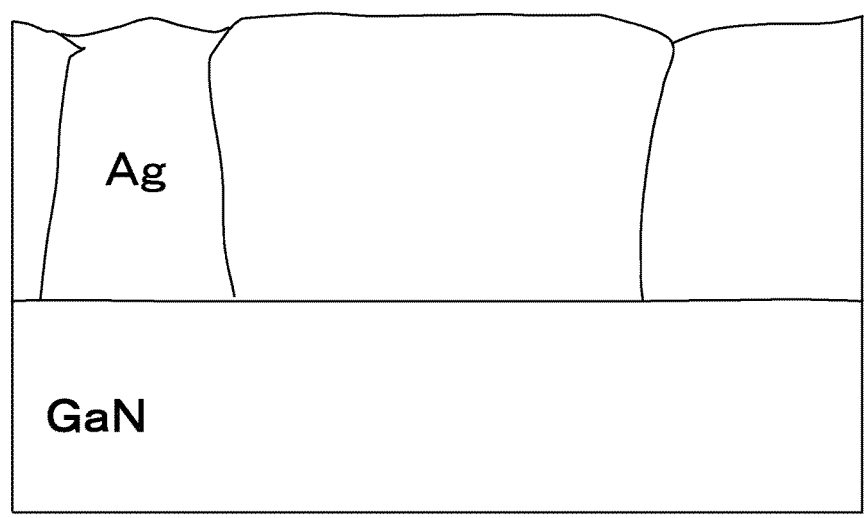
FIG. 24 is a cross-sectional view schematically showing the cross-sectional TEM image of FIG. 20.

Next, results of observation of cross-sectional TEM images of the above two samples on which heat treatment was performed are shown in FIG. 19, FIG. 20, FIG. 21, and FIG. 22. FIG. 19 is a comparative example, showing a cross-sectional TEM image of an interface, after heat treatment, of an Ag layer with an unmodified surface of an m-plane n-type GaN on which the Ag layer was formed. FIG. 20 is the inventive example, showing a cross-sectional TEM image of an interface, after heat treatment, of the Ag layer with a modified surface of the m-plane n-type GaN on which the Ag layer was formed. FIG. 21 is a comparative example, showing a cross-sectional TEM image of an interface, after heat treatment, of an Ag layer with an unmodified surface of an m-plane n-type GaN on which the Ag layer was formed. FIG. 22 is the inventive example, showing a cross-sectional TEM image of an interface, after heat treatment, of the Ag layer with a modified surface of the m-plane n-type GaN on which the Ag layer was formed. FIG. 23 schematically illustrates the cross-sectional TEM image of FIG. 19. FIG. 24 schematically illustrates the cross-sectional TEM image of FIG. 20. In the comparative example where the surface was not modified, a lot of nanoparticles are present in the Ag layer, and a maximum grain size is less than about 200 nm, as known from FIG. 19 and FIG. 23. On the other hand, in the inventive example where the surface was modified, only four crystal grains are present in the Ag layer shown in FIG. 20 and FIG. 24, and a maximum length of the crystal grain at the interface with the m-plane n-type GaN in an in-plane direction is not less than 200 nm and not more than 1200 nm, as known from the drawings. Further, the thickness of each of the crystal grains is not less than 200 nm, and each crystal grain extends from the lower surface to the upper surface of the Ag layer. Further, the length of the largest crystal grain at the interface in the in-plane direction is not less than 600 nm, and the thickness thereof is not less than 400 nm. The thickness of the Ag layer, that is, the thickness of the crystal grains may be not more than about 1200 nm, depending on the thickness of the film.

Further, it is known from FIG. 21 showing a comparative example where the surface was not modified, that arithmetic average roughness Ra of the GaN—Ag interface is larger than 2.65 nm in the case of a reference length of 3.5 μm. It is known from FIG. 22 showing the inventive example where the surface was modified, that the arithmetic average roughness Ra of the GaN—Ag interface is 0.27 nm in the case of a reference length of 3.5 μm. These observations reveal that the Ag layer on the modified surface of the n-type GaN is firmly connected to the GaN layer, and is strong against disturbances, such as heat.

Next, secondary ion mass spectrometry (SIMS) was performed on the above two samples on which heat treatment was performed, to find out that an oxygen concentration in the Ag layer formed on the unmodified surface of the m-plane n-type GaN was $4 \times 10^{19}$ cm$^{-3}$ and that an oxygen concentration at the Ag—GaN interface was $5 \times 10^{20}$ cm$^{-3}$. On the other hand, an oxygen concentration in the Ag layer formed on the modified surface of the m-plane n-type GaN was $1 \times 10^{19}$ cm$^{-3}$, and an oxygen concentration at the Ag—GaN interface was not less than $3 \times 10^{20}$ cm$^{-3}$ and not more than $2 \times 10^{21}$ cm$^{-3}$. These observations revealed that the oxygen concentration at the interface between the modified surface of the m-plane n-type GaN and the Ag layer was not less than 30 times and not more than 200 times the oxygen concentration in the Ag layer.

Here, both Ag and Al have the same face-centered cubic lattice. Thus, the crystal grain size, the arithmetic average roughness, and the oxygen concentration in the metal layer with respect to silver (Ag) in the second example described above also hold true for aluminum (Al) in the first example.

Other Embodiments

Figure 25:
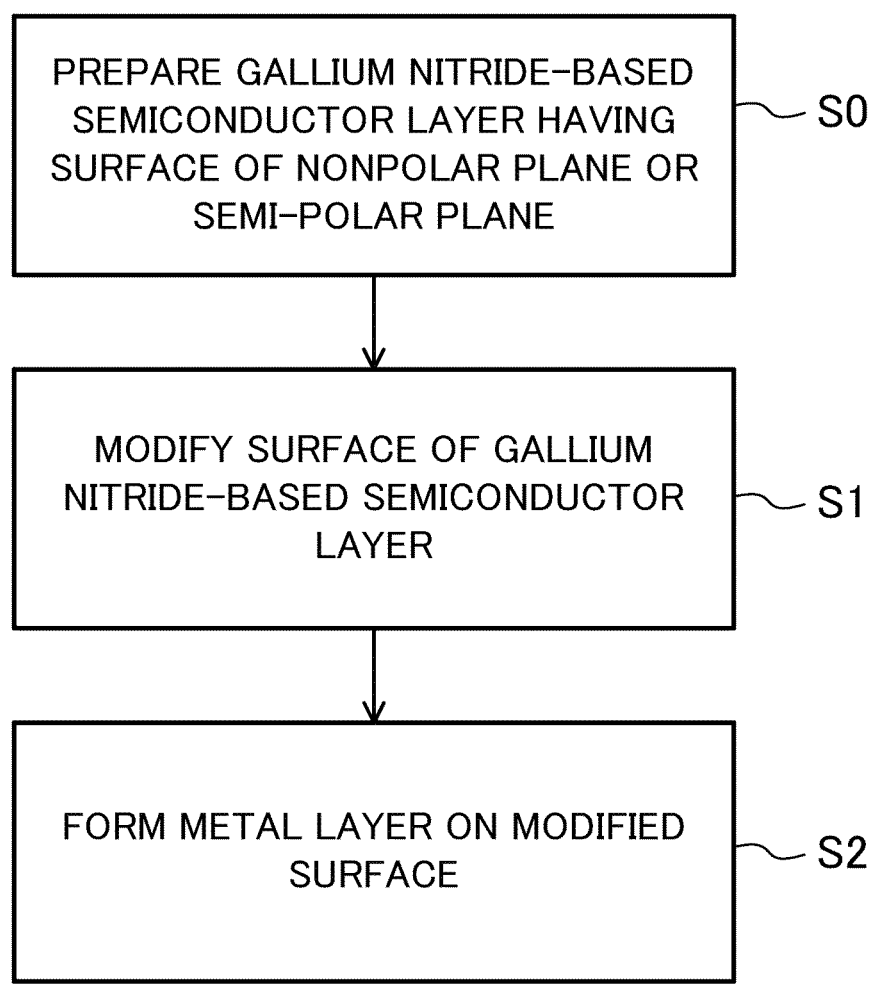
FIG. 25 is a flow chart showing an example method for manufacturing a structure including a gallium nitride-based semiconductor layer and a metal layer according to another embodiment.

FIG. 25 is a flow chart showing an example method for manufacturing a structure including a gallium nitride-based semiconductor layer ($Al_xGa_yIn_zN$ (where $0 \leq x < 1$, $0 < y \leq 1$, $0 \leq z < 1$, $x+y+z=1$)) and a metal layer according to another embodiment.

First, in step S0, a gallium nitride-based semiconductor layer with a surface that is a nonpolar plane or a semi-polar plane is prepared, as shown in FIG. 25. The gallium nitride-based semiconductor layer is an n-type GaN layer, for example.

Next, in step S1, the surface of the gallium nitride-based semiconductor layer which is n-type and is a nonpolar plane or a semi-polar plane is exposed to oxygen to modify the surface.

Next, in step S2, a metal layer containing Ag or Al or both of Ag and Al is formed on the modified surface. Thus, the interface between the gallium nitride-based semiconductor layer and the metal layer contains oxygen. Further, the metal layer has a structure which contains a crystal grain extending from the lower surface to the upper surface of the metal layer.

Predetermined heat treatment may be performed after step S2. For example, heat treatment in a nitrogen atmosphere at a temperature of 500° C. for about 10 to 20 minutes may be performed. Through this heat treatment, as well, the metal layer can have a structure which contains a crystal grain extending from the lower surface to the upper surface of the metal layer.

In the exposure processing of step S1, the surface of the gallium nitride-based semiconductor layer which is n-type and is a nonpolar plane or a semi-polar plane may be exposed to an atmosphere containing active oxygen. Further, in the exposure processing of step S1, the surface of the gallium nitride-based semiconductor layer which is n-type and is a nonpolar plane or a semi-polar plane may be irradiated with ultraviolet light, with the surface exposed to a gas or a liquid containing oxygen atoms or oxygen molecules. Further, in exposure processing of step S1, the surface of the gallium nitride-based semiconductor layer which is n-type and is a nonpolar plane or a semi-polar plane may be exposed to an atmosphere containing oxygen plasma.

Figure 26:
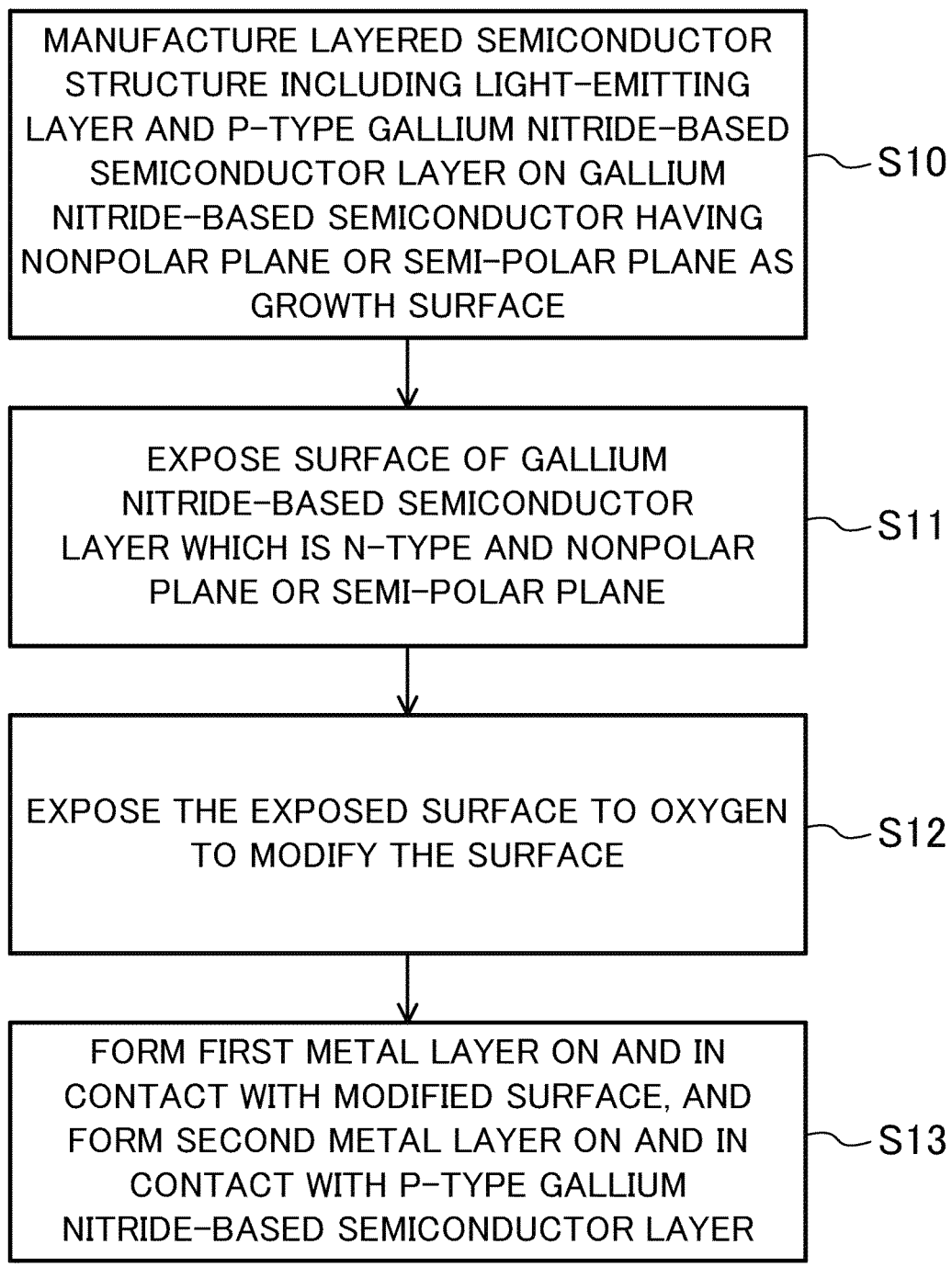
FIG. 26 is a flow chart showing an example method for manufacturing a gallium nitride-based semiconductor light-emitting device according to another embodiment.

FIG. 26 is a flow chart showing an example method for manufacturing a gallium nitride-based semiconductor light-emitting device according to another embodiment.

First, in step S10, a stacking semiconductor structure including a light-emitting layer and a p-type gallium nitride-based semiconductor layer is formed on a gallium nitride-based semiconductor (e.g., $Al_xGa_yIn_zN$ ($0 \leq x < 1$, $0 < y \leq 1$, $0 \leq z < 1$, $x+y+z=1$)) having a nonpolar plane or a semi-polar plane as a growth surface, as shown in FIG. 26. For example, the gallium nitride-based semiconductor is a substrate and an n-type gallium nitride-based semiconductor layer formed on the substrate. The substrate can be reduced in thickness or removed. The n-type gallium nitride-based semiconductor layer is, for example, an n-type GaN layer.

Next, in step S11, part of each of the stacking semiconductor structure and the gallium nitride-based semiconductor is removed to expose a surface of the gallium nitride-based semiconductor layer which is n-type and is a nonpolar plane or a semi-polar plane.

Next, in step S12, the exposed surface is exposed to oxygen to modify the surface.

Next, in step S13, a first metal layer is formed in contact with the modified surface. As the first metal layer, a metal containing Ag or Al or both of Ag and Al can be used. Further, a second metal layer is formed on and in contact with the p-type gallium nitride-based semiconductor layer. Either one of the first metal layer and the second metal layer can be formed first. Thus, the interface between the n-type GaN and the first metal layer contains oxygen. Further, the first metal layer has a structure which contains a crystal grain extending from the lower surface to the upper surface of the first metal layer.

Predetermined heat treatment may be performed after step S13. For example, heat treatment in a nitrogen atmosphere at a temperature of 500° C. for about 10 to 20 minutes may be performed. Through this heat treatment, as well, the first metal layer can have a structure which contains a crystal grain extending from the lower surface to the upper surface of the first metal layer.

In the exposure processing of step S12, the surface of the gallium nitride-based semiconductor layer which is n-type and is a nonpolar plane or a semi-polar plane may be exposed to an atmosphere containing active oxygen. Further, in the exposure processing of step S12, the surface of the gallium nitride-based semiconductor layer which is n-type and is a nonpolar plane or a semi-polar plane may be irradiated with ultraviolet light, with the surface exposed to a gas or a liquid containing oxygen atoms or oxygen molecules. Further, in the exposure processing of step S12, the surface of the gallium nitride-based semiconductor layer which is n-type and is a nonpolar plane or a semi-polar plane may be exposed to an atmosphere containing oxygen plasma.

Figure 27:
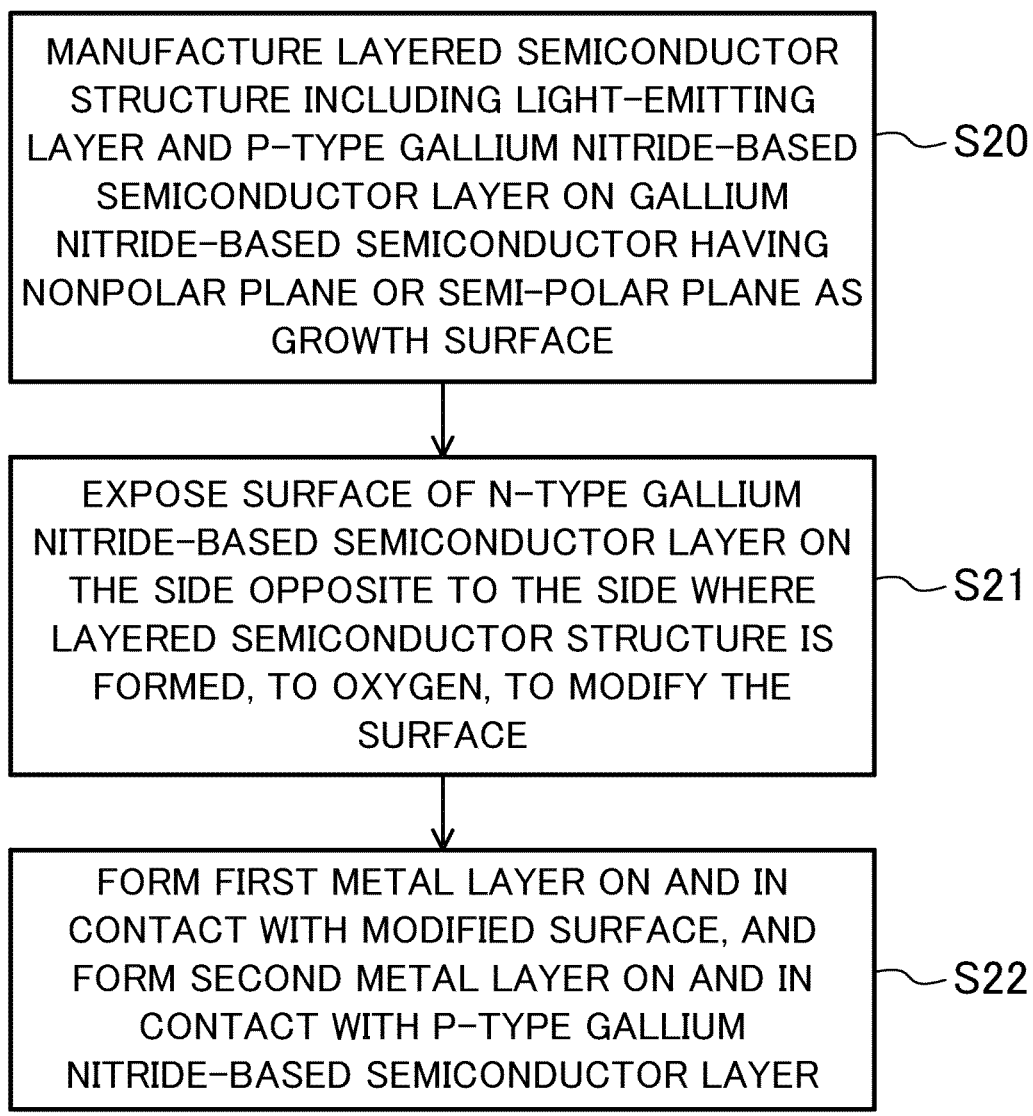
FIG. 27 is a flow chart showing an example method for manufacturing a gallium nitride-based semiconductor light-emitting device according to still another embodiment.

FIG. 27 is a flow chart showing an example method for manufacturing a gallium nitride-based semiconductor light-emitting device according to another embodiment.

First, in step S20, a stacking semiconductor structure including a light-emitting layer and a p-type gallium nitride-based semiconductor layer is formed on a gallium nitride-based semiconductor (e.g., $Al_xGa_yIn_zN$ ($0 \leq x < 1$, $0 < y \leq 1$, $0 \leq z < 1$, $x+y+z=1$)) having a nonpolar plane or a semi-polar plane as a growth surface, as shown in FIG. 27. For example, the gallium nitride-based semiconductor is a substrate and an n-type gallium nitride-based semiconductor layer formed on the substrate. The substrate can be reduced in thickness or removed. The substrate and the n-type gallium nitride-based semiconductor layer are n-type GaN layers, for example. A surface of the n-type gallium nitride-based semiconductor layer on the side opposite to the side where the stacking semiconductor structure is formed, is n-type and is a nonpolar plane or a semi-polar plane.

Next, in step S21, the surface opposite to the side where the stacking semiconductor structure has been formed in step S20, is exposed to oxygen to modify the surface.

Next, in step S22, a first metal layer is formed in contact with the modified surface. Further, a second metal layer is formed on and in contact with the p-type gallium nitride-based semiconductor layer.

Steps S21 and S22 are similar to steps S12 and S13 described above.

As described above, according to other embodiments, the affinity between the gallium nitride-based semiconductor and the metal layer becomes stronger, and the gallium nitride-based semiconductor and the metal layer form a definite interface, by modifying the surface of the gallium nitride-based semiconductor. As a result, not only a reflection coefficient, but also the reliability of the metal layer increase. Moreover, it is possible to provide a gallium nitride-based semiconductor light-emitting device in which an ohmic contact can be formed even between a gallium nitride-based semiconductor and a metal layer, e.g., Ag, between which an ohmic contact could not be formed by conventional techniques.

CONCLUSION

A preferable embodiment of the present invention derived from the above disclosure will be described below.

A nitride semiconductor light-emitting device comprising:
an n-type nitride semiconductor layer (41);
a p-type nitride semiconductor layer (53);
an active layer (52) sandwiched between the n-type nitride semiconductor layer (41) and the p-type nitride semiconductor layer (53);
an n-side electrode layer (42); and
a p-side electrode layer (54) formed on a surface of the p-type nitride semiconductor layer (53), wherein
each of the n-type nitride semiconductor layer (41), the active layer (52), and the p-type nitride semiconductor layer (53) has a principal plane of a nonpolar plane or a semi-polar plane,
the n-side electrode layer (42) has a first surface (42a) and a second surface (42b),
the first surface (42a) is in contact with at least part of a surface of the n-type nitride semiconductor layer (41),
the second surface (42b) is a surface opposite to the first surface (42a),
the n-side electrode layer (42) is formed of silver,
the part of the surface of the n-type nitride semiconductor layer (41) in contact with the n-side electrode layer (42) contains oxygen,
the n-side electrode layer (42) has a thickness of not less than 200 nm and not more than 1200 nm, and
the n-side electrode layer (42) includes a silver crystal grain extending from the first surface (42a) to the second surface (42b).

Another preferable embodiment of the present invention derived from the above disclosure will be described below.

A nitride semiconductor light-emitting device comprising:
a n-type nitride semiconductor layer (41);
a p-type nitride semiconductor layer (53);
an active layer (52) sandwiched between the n-type nitride semiconductor layer (41) and the p-type nitride semiconductor layer (53);
an n-side electrode layer (42); and
a p-side electrode layer (54) formed on a surface of the p-type nitride semiconductor layer (53), wherein
each of the n-type nitride semiconductor layer (41), the active layer (52), and the p-type nitride semiconductor layer (53) has a principal plane of a nonpolar plane or a semi-polar plane,
the n-side electrode layer (42) has a first surface (42a) and a second surface (42b),
the first surface (42a) is in contact with at least part of a surface of the n-type nitride semiconductor layer (41),
the second surface (42b) is a surface opposite to the first surface (42a),
the n-side electrode layer (42) is formed of silver,
the part of the surface of the n-type nitride semiconductor layer (41) in contact with the n-side electrode layer (42) contains oxygen, the n-side electrode layer (42) has a thickness of not less than 200 nm and not more than 1200 nm, and the n-side electrode layer (42) includes a plurality of silver crystal grains each extending from the first surface (42a) to the second surface (42b).

A structure and a manufacturing method of the structure, and a gallium nitride-based semiconductor light-emitting device using the structure and a manufacturing method of the device are applicable to the fields of display, lighting, and optical information.

What is claimed is:

1. A structure, comprising:
   a gallium nitride-based semiconductor layer having an m-plane as a principal plane; and
   a silver layer provided on the principal plane, wherein
   the principal plane has an n-type conductivity,
   an interface between the gallium nitride-based semiconductor layer and the silver layer contains oxygen,
   the silver layer includes a crystal grain extending from a lower surface to an upper surface of the silver layer, and
   an oxygen concentration at the interface between the gallium nitride-based semiconductor layer and the silver layer is not less than 30 times and not more than 200 times an oxygen concentration in the silver layer.

2. The structure of claim 1, wherein
   surface plasmon resonance absorption is not observed in light reflected by the interface between the gallium nitride-based semiconductor layer and the silver layer, within a wavelength range of from 450 nm to 500 nm.

3. The structure of claim 1, wherein
   the silver layer has a thickness of not less than 200 nm.

4. The structure of claim 1, wherein
   the silver layer has a thickness of not more than 1200 nm.

5. The structure of claim 1, wherein
   the crystal grain has a maximum length of not less than 200 nm.

6. The structure of claim 1, wherein
   the crystal grain has a maximum length of not more than 1200 nm.

7. The structure of claim 1, wherein
   an arithmetic average roughness Ra of the interface of the silver layer with the gallium nitride-based semiconductor layer in an in-plane direction is not less than 0.27 nm and not more than 2.65 nm in the case of a reference length of 3.5 µm.

8. A gallium nitride-based semiconductor light-emitting device, comprising:
   the structure of claim 1;
   a p-type gallium nitride-based semiconductor layer, and
   a light-emitting layer sandwiched between the gallium nitride-based semiconductor layer and the p-type gallium nitride-based semiconductor layer, wherein
   the gallium nitride-based semiconductor layer is an n-type gallium nitride-based semiconductor layer, and
   the silver layer is an electrode for the n-type gallium nitride-based semiconductor layer.

9. A structure, comprising:
   a gallium nitride-based semiconductor layer having an m-plane as a principal plane; and
   a silver layer provided on the principal plane, wherein
   the principal plane has an n-type conductivity,
   an interface between the gallium nitride-based semiconductor layer and the silver layer contains oxygen,
   the silver layer includes a crystal grain extending from a lower surface to an upper surface of the silver layer,
   an oxygen concentration at the interface between the gallium nitride-based semiconductor layer and the silver layer is not less than $3 \times 10^{20}$ cm$^{-3}$ and not more than $2 \times 10^{21}$ cm$^{-3}$, and
   an oxygen concentration in the silver layer is not more than $1 \times 10^{19}$ cm$^{-3}$.

10. The structure of claim 9, wherein
    surface plasmon resonance absorption is not observed in light reflected by the interface between the gallium nitride-based semiconductor layer and the silver layer, within a wavelength range of from 450 nm to 500 nm.

11. The structure of claim 9, wherein
    the silver layer has a thickness of not less than 200 nm.

12. The structure of claim 9, wherein
    the silver layer has a thickness of not more than 1200 nm.

13. The structure of claim 9, wherein
    the crystal grain has a maximum length of not less than 200 nm.

14. The structure of claim 9, wherein
    the crystal grain has a maximum length of not more than 1200 nm.

15. The structure of claim 9, wherein
    an arithmetic average roughness Ra of the interface of the silver layer with the gallium nitride-based semiconductor layer in an in-plane direction is not less than 0.27 nm and not more than 2.65 nm in the case of a reference length of 3.5 µm.

16. A gallium nitride-based semiconductor light-emitting device, comprising:
    the structure of claim 9;
    a p-type gallium nitride-based semiconductor layer, and
    a light-emitting layer sandwiched between the gallium nitride-based semiconductor layer and the p-type gallium nitride-based semiconductor layer, wherein
    the gallium nitride-based semiconductor layer is an n-type gallium nitride-based semiconductor layer, and
    the silver layer is an electrode for the n-type gallium nitride-based semiconductor layer.

* * * * *